(12) United States Patent
Lu et al.

(10) Patent No.: US 12,100,333 B2
(45) Date of Patent: *Sep. 24, 2024

(54) HYBRID ARCHITECTURE FOR ZERO BORDER DISPLAY

(71) Applicant: Apple Inc., Cupertino, CA (US)

(72) Inventors: Xiang Lu, Campbell, CA (US); Mahdi Farrokh Baroughi, Santa Clara, CA (US); Xiaofeng Wang, San Jose, CA (US); Derek K. Shaeffer, Redwood City, CA (US); Henry C. Jen, Los Altos, CA (US); Hopil Bae, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/342,979

(22) Filed: Jun. 28, 2023

(65) Prior Publication Data

US 2024/0038129 A1 Feb. 1, 2024

Related U.S. Application Data

(63) Continuation of application No. 17/727,197, filed on Apr. 22, 2022, now Pat. No. 11,727,850, which is a continuation of application No. 17/088,809, filed on Nov. 4, 2020, now Pat. No. 11,341,893, which is a
(Continued)

(51) Int. Cl.
| | |
|---|---|
| *G06F 3/038* | (2013.01) |
| *G09G 3/20* | (2006.01) |
| *G09G 3/3216* | (2016.01) |
| *G09G 3/3275* | (2016.01) |
| *H10K 59/17* | (2023.01) |

(52) U.S. Cl.
CPC ......... *G09G 3/2085* (2013.01); *G09G 3/3216* (2013.01); *G09G 3/3275* (2013.01); *H10K 59/17* (2023.02)

(58) Field of Classification Search
CPC ............... G09G 3/3216; G09G 3/3275; G09G 2300/0413; G09G 3/32; H01L 27/3281
USPC ........................................ 345/204, 207, 690
See application file for complete search history.

(56) References Cited

U.S. PATENT DOCUMENTS

| | | |
|---|---|---|
| 8,207,954 B2 | 6/2012 | Cok et al. |
| 8,624,882 B2 | 1/2014 | Cok et al. |
| 10,395,594 B1 | 8/2019 | Charisoulis et al. |

(Continued)

FOREIGN PATENT DOCUMENTS

| | | |
|---|---|---|
| CN | 101650914 A | 2/2010 |
| WO | 2016200635 A1 | 12/2016 |

OTHER PUBLICATIONS

PCT/US2019/033740 "Invitation To Pay Additional Fees And, Where Applicable, Protest Fee" mailed Jul. 26, 2019, 18 pages.
(Continued)

*Primary Examiner* — Thuy N Pardo
(74) *Attorney, Agent, or Firm* — Aikin & Gallant, LLP

(57) ABSTRACT

Hybrid architectures and method methods of operating a display panel are described. In an embodiment, row driver and pixel driver functions are combined in a group of backbone hybrid pixel driver chips, wherein global signal lines are distributed to the backbone hybrid pixel driver chips, where the global signals are manipulated and distributed to a row of pixel driver chips.

20 Claims, 17 Drawing Sheets

Related U.S. Application Data continuation of application No. 16/356,914, filed on Mar. 18, 2019, now Pat. No. 10,854,129.

(60) Provisional application No. 62/686,297, filed on Jun. 18, 2018.

(56) References Cited

U.S. PATENT DOCUMENTS

| | | |
|---|---|---|
| 10,854,129 B2 | 12/2020 | Lu et al. |
| 2006/0038501 A1 | 2/2006 | Koyama et al. |
| 2006/0139254 A1 | 6/2006 | Hayakawa et al. |
| 2006/0267889 A1 | 11/2006 | Kimura |
| 2008/0094009 A1 | 4/2008 | Koyama et al. |
| 2009/0322649 A1 | 12/2009 | Hamer et al. |
| 2010/0207851 A1 | 8/2010 | Cok et al. |
| 2010/0265224 A1 | 10/2010 | Cok |
| 2010/0328196 A1 | 12/2010 | Cok |
| 2011/0279441 A1 | 11/2011 | Hayakawa et al. |
| 2012/0206421 A1 | 8/2012 | Cok et al. |
| 2012/0301150 A1 | 11/2012 | Kawahito |
| 2012/0306728 A1 | 12/2012 | Koyama et al. |
| 2013/0248829 A1 | 9/2013 | Smith |
| 2015/0169011 A1 | 6/2015 | Bibl et al. |
| 2015/0251402 A1 | 9/2015 | Cok |
| 2018/0115729 A1 | 4/2018 | Ise et al. |
| 2018/0182279 A1 | 6/2018 | Sakariya et al. |
| 2018/0189804 A1 | 7/2018 | Diceman |
| 2018/0211582 A1 | 7/2018 | Sakariya et al. |
| 2018/0247586 A1 | 8/2018 | Vahid Far et al. |
| 2019/0096864 A1 | 3/2019 | Huitema et al. |
| 2019/0222784 A1 | 7/2019 | Ise et al. |
| 2019/0311256 A1 | 10/2019 | Hack |
| 2019/0347985 A1* | 11/2019 | Shaeffer ............... G09G 3/2003 |
| 2019/0385509 A1 | 12/2019 | Lu et al. |
| 2020/0184884 A1 | 6/2020 | Lau et al. |
| 2020/0258875 A1 | 8/2020 | Hu |
| 2021/0016609 A1 | 1/2021 | Kitora |
| 2021/0118353 A1 | 4/2021 | Sakariya et al. |
| 2021/0150978 A1* | 5/2021 | Iguchi ....................... G09F 9/33 |
| 2021/0257350 A1 | 8/2021 | Hu |
| 2021/0366349 A1 | 11/2021 | Sakariya et al. |

OTHER PUBLICATIONS

PCT/US2019/033740 "Notification of Transmittal of the International Search Report and the Written Opinion of the International Searching Authority" mailed Sep. 17, 2019, 19 pages.

* cited by examiner

HYBRID ARCHITECTURE FOR ZERO BORDER DISPLAY

RELATED APPLICATIONS

This application is a continuation of co-pending U.S. patent application Ser. No. 17/727,197, filed Apr. 22, 2022, which is a continuation of U.S. application Ser. No. 17/088,809, filed Nov. 4, 2020, now U.S. Pat. No. 11,341,893 which is a continuation of U.S. patent application Ser. No. 16/356,914, filed Mar. 18, 2019, now U.S. Pat. No. 10,854,129, which claims priority to U.S. Provisional Application No. 62/686,297 filed Jun. 18, 2018. Both U.S. patent application Ser. No. 16/356,914 and U.S. Provisional Application No. 62/686,297 are incorporated herein by reference.

BACKGROUND

Field

Embodiments described herein relate to a display system, and more specifically to passive matrix displays and methods of operation.

Background Information

Display panels are utilized in a wide range of electronic devices. Common types of display panels include active matrix display panels where each pixel element, e.g. light emitting diode (LED), may be individually driven to display a data frame, and passive matrix display panels where rows and columns of pixel elements may be driven in a data frame. Both active and passive matrices have been proposed for the fabrication of tiled displays, where display panel dimensions are larger than the limitations imposed on substrate and equipment size restrictions.

SUMMARY

Hybrid architecture display panels and methods of operation are described. In embodiment, a display panel includes a bus column of global signal lines, a plurality of rows of row function signal lines, and a plurality of rows of pixel driver chips, each row of pixel driver chips connected to a corresponding row of row function signal lines, each pixel driver chip connected to a corresponding matrix of light emitting diodes (LEDs). Each row of pixel driver chips can include a group of backbone hybrid pixel driver chips and a group of LED driving pixel driver chips. The bus column of global signal lines is coupled to the group of backbone hybrid pixel driver chips for each row of pixel driver chips and each separate backbone hybrid pixel driver chip includes an input connected to a corresponding global signal line and an output connected to a corresponding row function signal line within a corresponding row of row function signal lines to transmit a corresponding manipulated signal to the corresponding row of pixel driver chips.

In an embodiment, a hybrid pixel driver chip includes a VST driver circuity to determine whether the particular row is on or off, and to propagate VST signals from the top to bottom of the display panel. In addition, the hybrid pixel drive chip includes a signal modulator circuitry to select whether to use a global row function signal line or backup line input, and transmit an internal signal to a multiplexer driver circuitry, which generates a manipulated row function signal. Additionally, the hybrid pixel drier chips include LED driving circuitry 1460 to drive a corresponding matrix of LEDs. Thus, the hybrid pixel driver chips include a hybrid architecture to support row driver functions and pixel driver functions.

In an embodiment, a method of programming a display includes propagating VST signals to a row of pixel driver chips, receiving token driver configuration data with a backbone hybrid pixel driver chip, receiving a global configuration update pulse with the backbone hybrid pixel driver chip, receiving row driver configuration data with the token activated backbone hybrid pixel driver chip, and transmitting a manipulated configuration update signal from the backbone hybrid pixel driver chip to the row of pixel driver chips.

DETAILED DESCRIPTION

Figure 1:
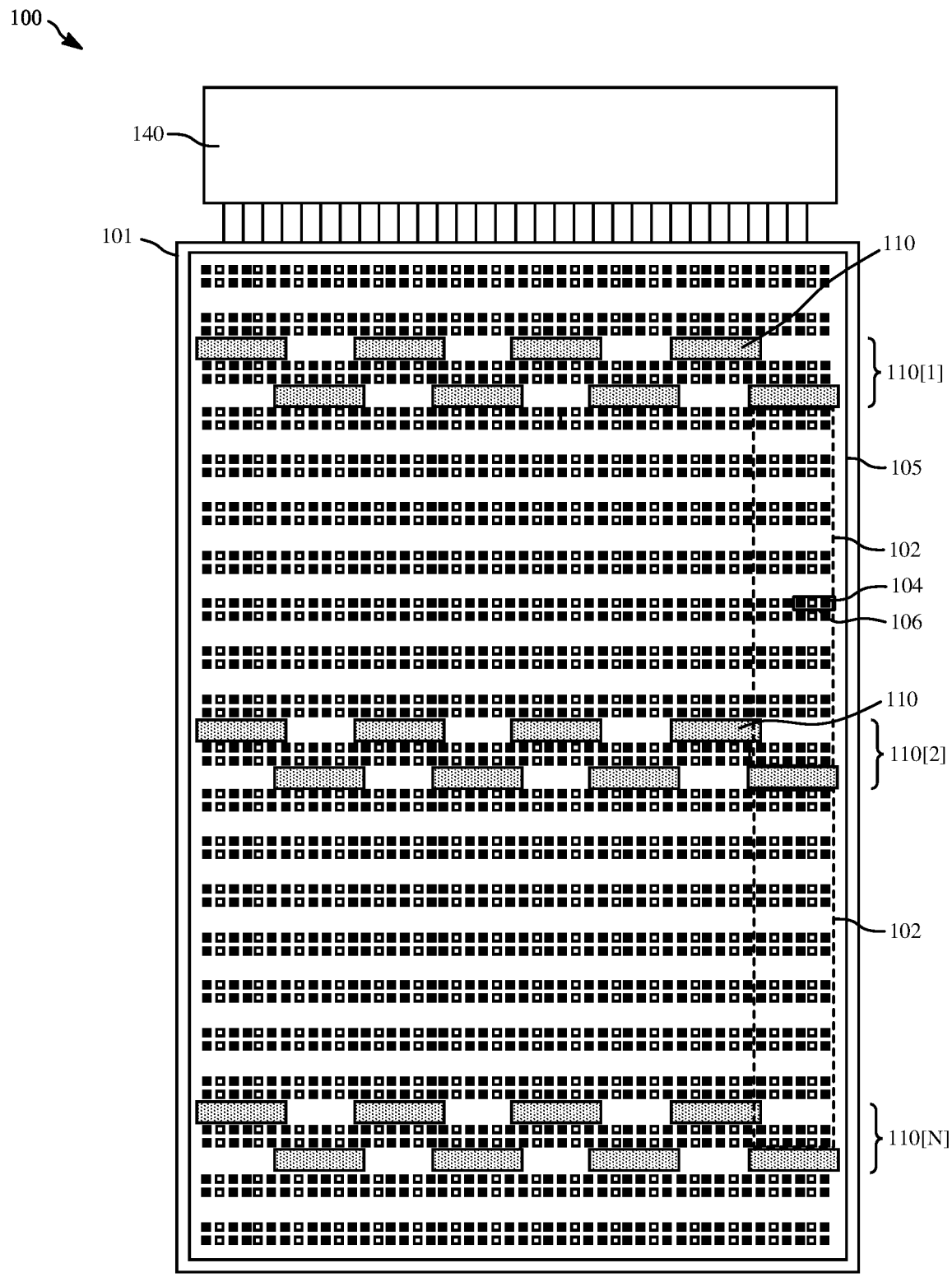
FIG. 1 is schematic top view illustration of a local passive matrix display including rows of hybrid pixel driver chips in accordance with an embodiment.

Embodiments describe hybrid architectures and method methods of operating a display panel in which row function circuitry and pixel driving function circuitry are combined in a backbone of hybrid pixel driver chips. In this manner total silicon chip area can be reduced with elimination of specified row driver chips. In addition, the arrangement facilitates the fabrication of tile-based display panel arrangements with configurable sizes and shapes, and reduced borders, or zero borders, where areas traditionally reserved for driver ledges may be omitted.

In some embodiments the tile-based display panels may include an arrangement of pixel driver chips to drive local matrices of pixels in a local passive matrix (LPM). Compared to direct drive approach, where every pin of the pixel driver is connected to one LED, the LPM arrangements in accordance with embodiments may significantly reduce the silicon area associated with the pixel drivers, and the panel peak panel current. In some embodiments the pixel driver chips are distributed between LEDs. Such a configuration may include pixel driver chips being laterally between LEDs on the same side of the display substrate. Depending upon complexity, the pixel driver chips may be longer than the corresponding LED matrices they control (e.g. wider than row length of a corresponding matrix). As a result, the pixel driver chips may be staggered, for example, in zigzag patterned rows. It is not required that the pixel driver chips be mounted on the same surface as the LEDs, or between the LEDs. In accordance with all embodiments described herein the pixel driver chips may also be located within the display substrate, and may be positioned face up (e.g. with terminals facing up towards the LEDs), positioned face down (e.g. with terminals facing away from the LEDs), or both (with terminals on both top and bottom sides). Thus, where the pixel driver chips are described herein as being distributed about a display area, or interspersed with a display area, it is understood the pixel driver chips may be on the display substrate (e.g. surface mounted) or embedded within the display substrate. In accordance with all embodiments described herein the pixel driver chips may be adjacent a corresponding plurality of pixels. Likewise, this includes configurations of both pixel drivers chips on or within the display substrate, where the pixel driver chips are adjacent to LEDs on the display substrate. The tile-based LPM displays in accordance with embodiments may be implemented in both large area displays, as well as high resolution displays with high pixel density. Furthermore, LED and pixel driver chip sizes are scalable from macro to micro sized. In an embodiment, the pixel driver chips may have a maximum dimension of less than 200 μm, or even less than 100 μm, with LED maximum dimensions of less than 100 μm, or even less than 20 μm, such as less than 10 μm, or even less than 5 μm for displays with high resolution and pixel density.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known techniques and components have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

FIG. 1 is schematic top view illustration of a local passive matrix display 100 including rows [1, 2, . . . N] of pixel driver chips 110 in accordance with an embodiment. Each pixel driver chip 110 may include two portions or slices 0, 1 for operation of pixel matrices 102 above and under the pixel driver chip 110. The slices 0, 1 may be separated into primary/redundant configurations, or master/slave configurations. Each matrix 102 may include a plurality of LEDs 104 and a plurality of pixels 106. In some configurations, the rows of pixel driver chips 110 are arranged in rows with every other row being a row of primary pixel driver chips (e.g. row 1, 3, etc.) or row of redundant pixel driver chips 110 (e.g. row 2, 4, etc.). It is to be appreciated that the number and size of the pixel driver chips 110 within the display area 105 is not necessarily drawn to scale, and is enlarged for illustrational purposes.

Generally, the local passive matrix display 100 may include a display substrate 101, a display area 105, optional column drivers or signal line driving circuits, and an external control circuit 140 that is attached with the display substrate 101 to supply various control signals, video signals, and power supply voltage to the display substrate 101.

Figure 2:
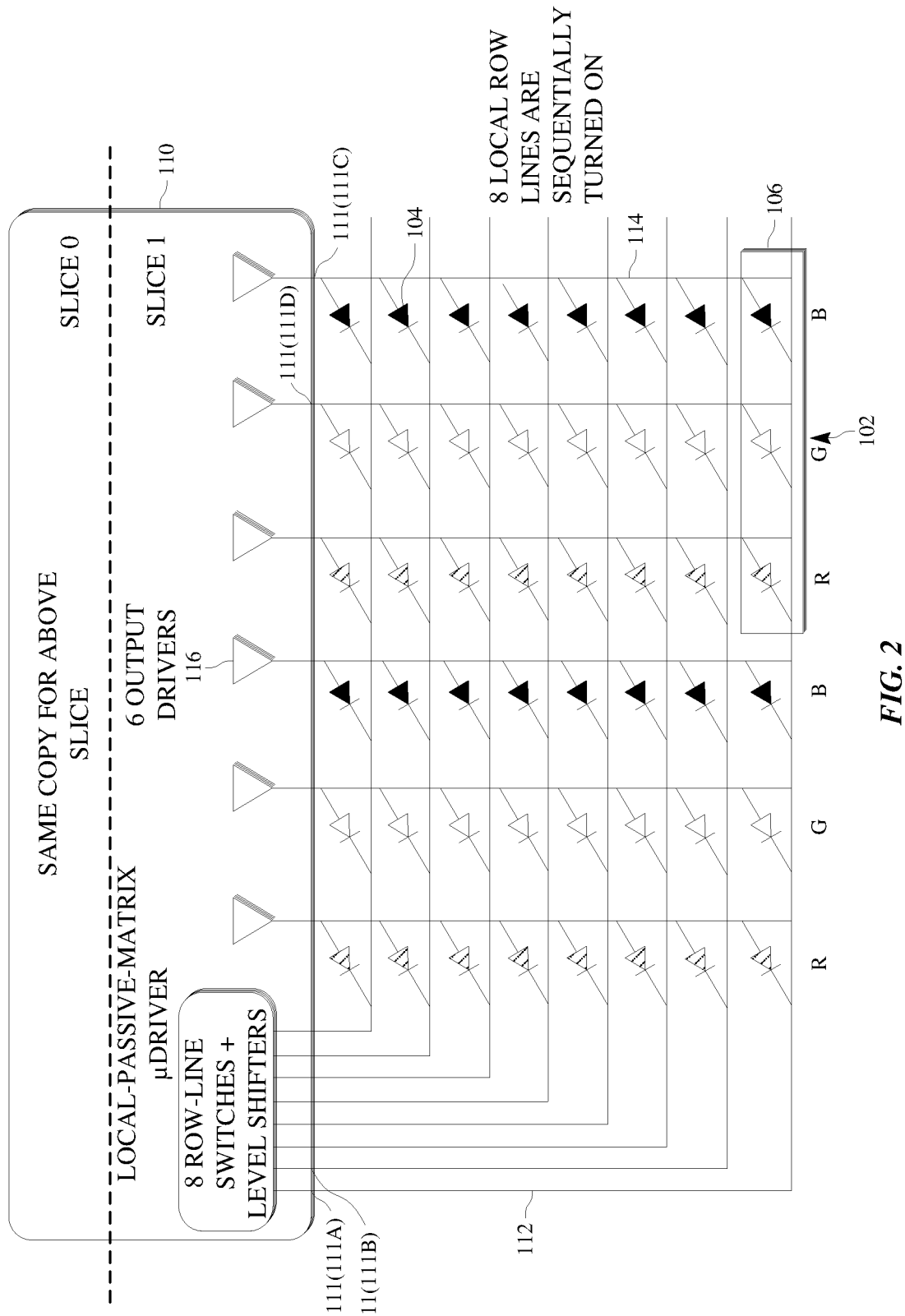
FIG. 2 is a schematic diagram of a matrix of light emitting diodes (LEDs) coupled with terminals of a hybrid pixel driver chip in accordance with an embodiment.

Referring now to FIG. 2, a schematic diagram of a matrix 102 of light emitting diodes (LEDs) coupled with terminals of a pixel driver chip is provided in accordance with an embodiment. In an embodiment, a local passive matrix display includes a pixel driver chip 110, a plurality of pixels 106 arranged in a plurality of display rows, and a plurality of terminals 111 of the pixel driver chip 110 coupled with the LEDs 104 of the plurality of pixels 106. As shown in FIG. 2, a portion of the terminals 111 are coupled with corresponding row-line switches and level shifters within the pixel driver chip 110 and corresponding rows of LEDs 104, and a portion of the terminals 111 are coupled with output drivers 116 of the pixel driver chip 110 and corresponding columns of LEDs 104. For example, interconnects 112 may connect to electrodes (e.g. cathodes) of a row of LEDs 104 to corresponding row-line switches and level shifters, while interconnects 114 may connect electrodes (e.g. anodes) of a column of LEDs 104 to corresponding output drivers 116, or vice-versa. The particular embodiment illustrated in FIG. 2 illustrates as matrix 102 of LEDs 104 connected to a portion of the pixel driver chip 110, and more specifically to "slice 1" of the pixel driver chip 110. Similar connections may also be provided for the second portion, or "slice 0", of the pixel driver chip 110. It is to be appreciated, that usage of the term "slice" is simplified, and in no way suggests a geometric split of circuitry within the pixel driver chips 110, and instead is a simplistic reference to top and bottom connections in the illustration. Additionally, the particular selection of eight rows and six columns of LEDs within a matrix is exemplary, and embodiments are not so limited.

In an embodiment, a first terminal 111A of the pixel driver chip 110 is coupled with a first row of light emitting diodes (LEDs) 104 of the plurality of pixels, a second terminal 111B of the pixel driver chip 110 is coupled with a second row of LEDs of the plurality of pixels, and a third terminal 111C is coupled with a first column of LEDs of the plurality of pixels, the first column of LEDs including a first LED of the first string (e.g. row) of LEDs and a first LED of the second string (e.g. row) of LEDs. A fourth terminal 111D is coupled with a second column of LEDs of the plurality of pixels, the second column of LEDs including a second LED of the first string of LEDs and a second LED of the second string of LEDs. As shown, the third terminal may be coupled with a first output driver 116 of the pixel driver chip, and the fourth terminal coupled with a second output driver 116 of the pixel driver chip. As shown in FIG. 1, the pixel driver chip 110 may be in a row of pixel driver chips in a line across the display substrate. In other embodiments, the row of pixel driver chips may be curved along the display area of the display substrate.

In the embodiment illustrated, the rows of LEDs 104 correspond to different emission colors of LEDs, such as red (R), green (G), blue (B) in an RGB pixel arrangement. Alternative pixel arrangement may also be used.

Figure 3:
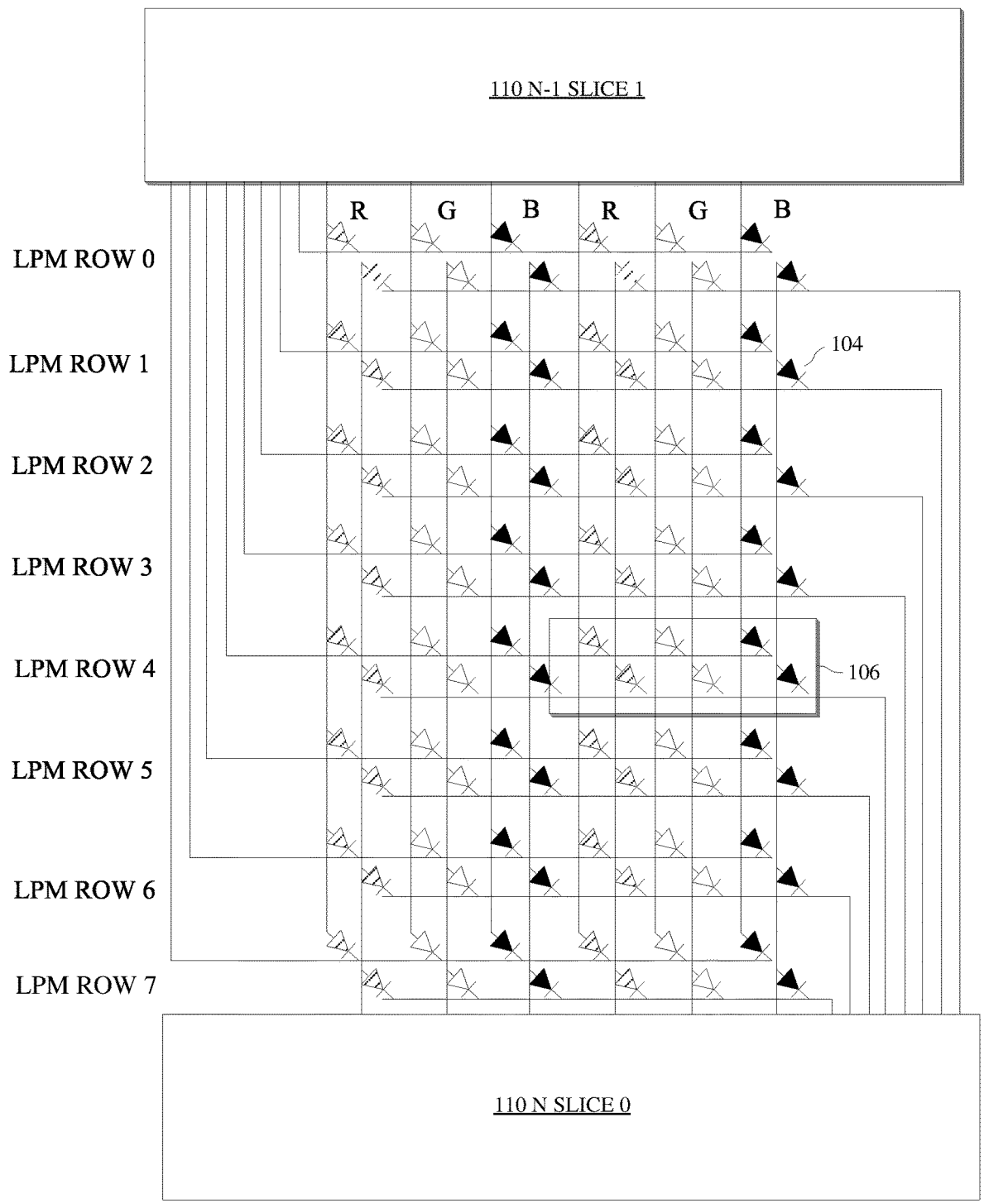
FIG. 3 is a schematic diagram of a matrix of redundant pairs of LEDs being driven by redundant pairs of hybrid pixel driver chips in accordance with an embodiment.

FIG. 3 is a schematic diagram of a matrix of redundant pairs of LEDs being driven by redundant pairs of pixel driver chips in accordance with an embodiment. FIG. 3 illustrates a matrix 102 similar to that illustrated in FIG. 2, with the addition of redundant LEDs 104 within the pixels 106. In such an embodiment, a portion (slice 1) of pixel driver chip 110 N-1 includes terminals 111 coupled with the LEDs 104, similar as described with regard to FIG. 2. In addition, within the same matrix 102, a portion (slice 0) of pixel driver chip 110 N, e.g. in the next row of pixel driver chips, is also similarly coupled with redundant LEDs 104, with separate interconnects 112, 114. In this manner, providing separate anode and separate cathode contacts for pixel driver chip N-1 and pixel driver chip N can prevent timing conflict between the primary and pixel driver portions (e.g. slice 0, slice 1) associated with the same matrix 102.

In an embodiment, such as that illustrated in FIG. 3, separate cathodes can be provided for primary and redundant portions, or slices, of the pixel driver chips 110. In one method of operation, half of the pixel driver chips 110 (e.g. primary pixel driver chips 110) are active by default. Thus, every other row of pixel driver chips 110 is active. The LEDs 104 coupling with the pixel driver chips 110 may also be staggered, for example, to mitigate visual artifacts.

In some embodiments, a master portion, or slice 0, of each pixel driver chip is default active for each pixel driver chip, and the slave portion, or slice 1, of each pixel driver chip is default inactive. Thus, a slave or redundant portion only becomes active if a master or primary portion from an adjacent pixel driver chip is defective, or inactive. In some embodiments, both portions or slices 0, 1 of a primary pixel driver chip are default active, while the corresponding portions or slices 0, 1 of a redundant pixel driver chip are default inactive. Thus, a portion, or whole, of a redundant pixel driver chip only becomes active if an adjacent primary pixel driver chip portion is defective, or inactive. In accordance with embodiments, the arrangements of LED matrices, pixel driver chips, and redundancy configurations, may result in particular LED emission progressions in operation of the display panel.

Figure 4:
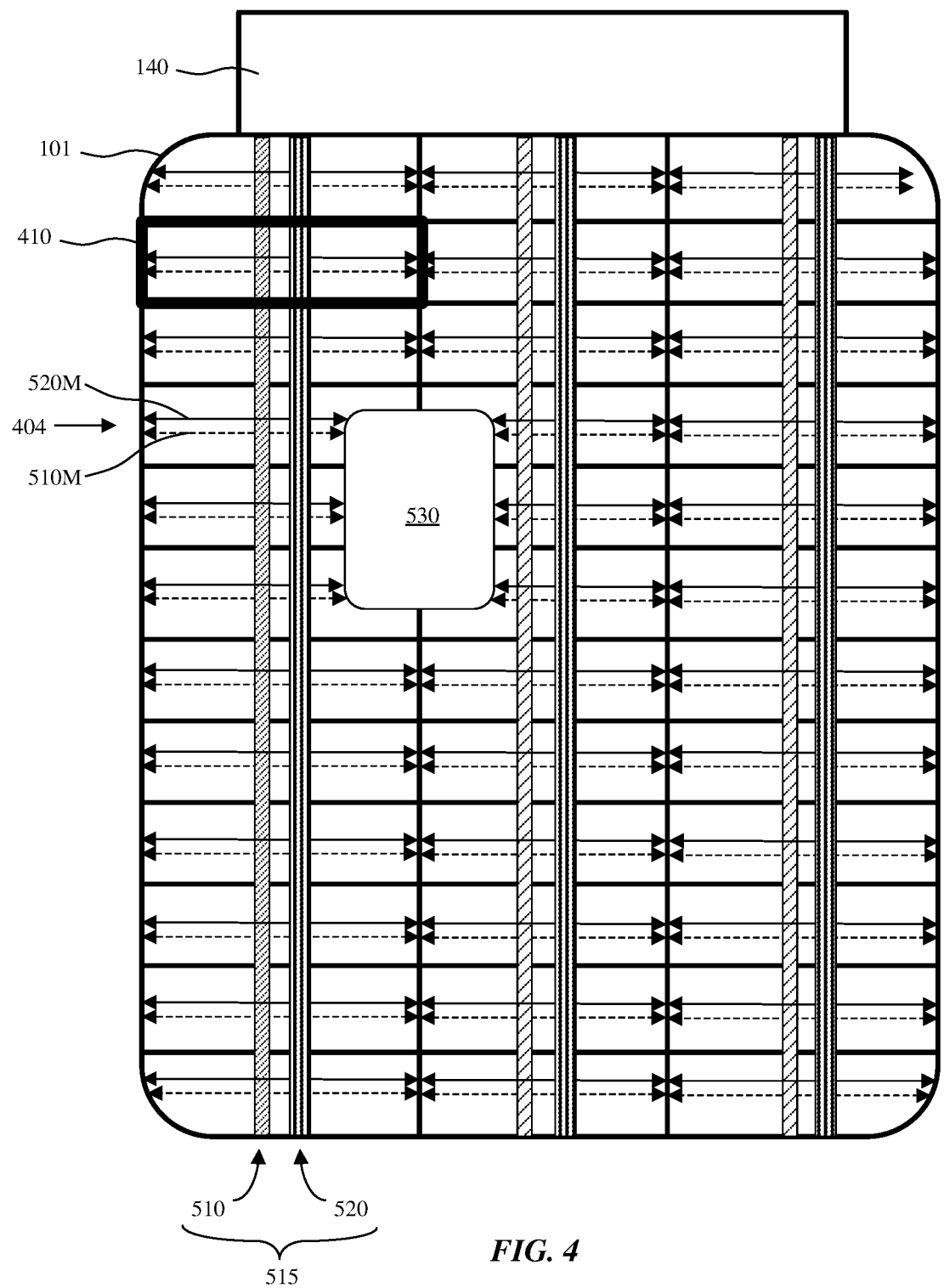
FIG. 4 is schematic top view illustration of a tile-based display panel with a cut-out and spline-corners in accordance with an embodiment.

FIG. 4 is schematic top view illustration of a tile-based display panel with a cut-out 530 and spline-corners in accordance with an embodiment. In particular, the arrangement of pixel driver chips 110 in accordance with embodiments can remove the requirement for driver ledges on the edges of a display panel. As a result, the display substrates 101 may have reduced borders, or zero borders outside of the display area. The configuration may facilitate the formation of display panels with curved edges, as well as cutouts 530. In addition, the configuration may facilitate modular arrangements, including micro arrangements, of display tiles 410. Generally, the control circuit 140 may be coupled to an edge of the display substrate 101. Bus columns 515 of global signal lines may extend from the control circuit 140 to supply global signals to the display panel. For example, the global signal lines may include at least data clock lines 510 and emission clock lines 520. The global signal lines are coupled to a plurality of "hybrid" pixel driver chips, and together form a backbone of the display, or display tile 410. The corresponding backbone hybrid pixel driver chips receive the global signals and then transmit manipulated signals to their corresponding rows 404 of row signal lines connected to the other pixel driver chips 110 within the same row. For example, the global data clock and emission clock signals may be converted to manipulated signals and transmitted to the row of pixel driver chips 110 along manipulated data clock lines 510M and manipulated emission clock lines 520M. For example, the manipulated signals may include only the necessary information for the particular row.

The tile-based display panels in accordance with embodiments may have various arrangements of display tiles 410. For example, the display tiles 410 may be arranged side-by-side (horizontally), stacked (vertically), both, as well as other configurations. Additionally, the bus columns 515 of global signal lines may be aligned and connected for stacked display tiles 410.

Figure 5A:
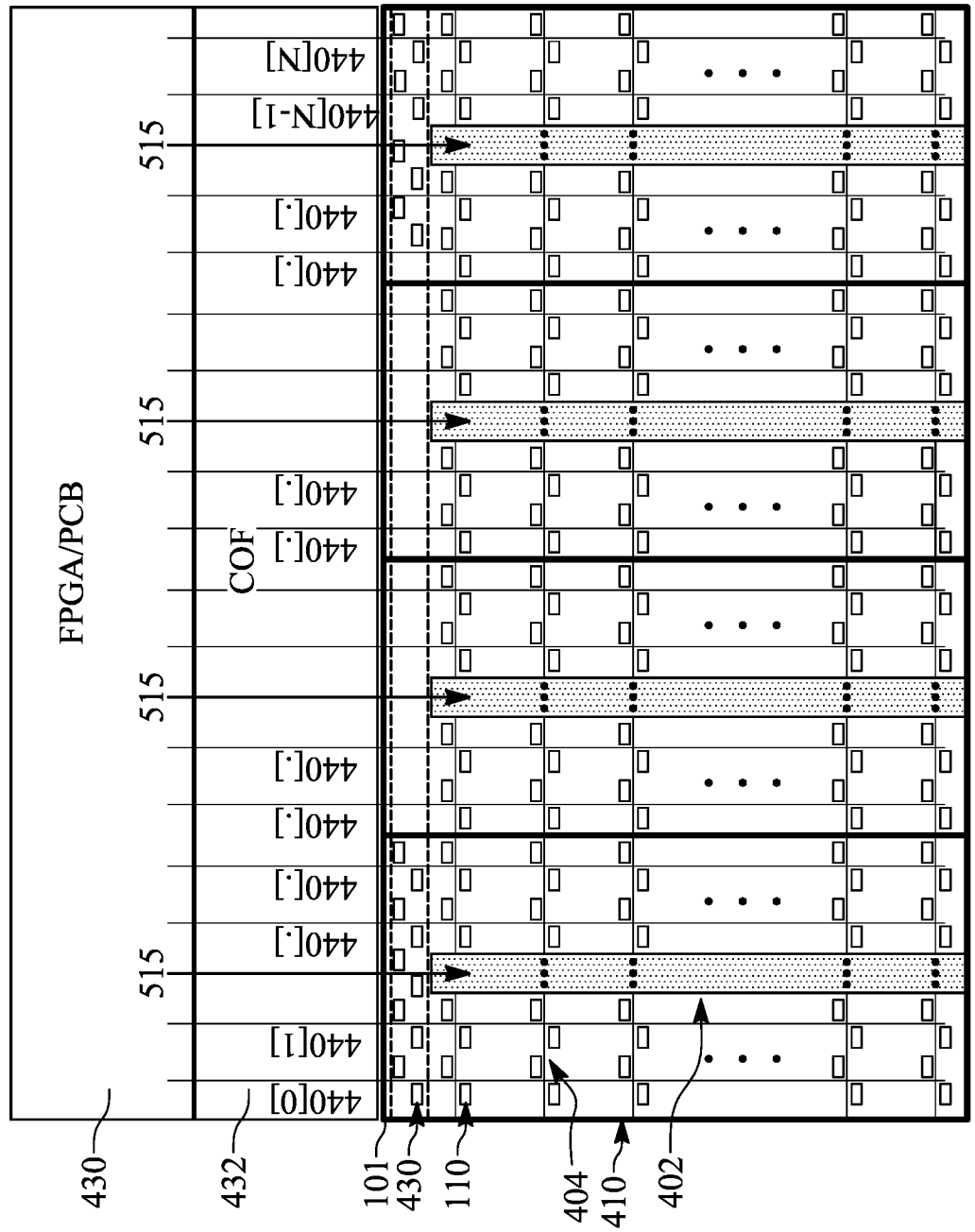
FIG. 5A is schematic top view illustration of a tile-based display including tile backbones of hybrid pixel driver chips that serve as row drivers in accordance with an embodiment.
Figure 5B:
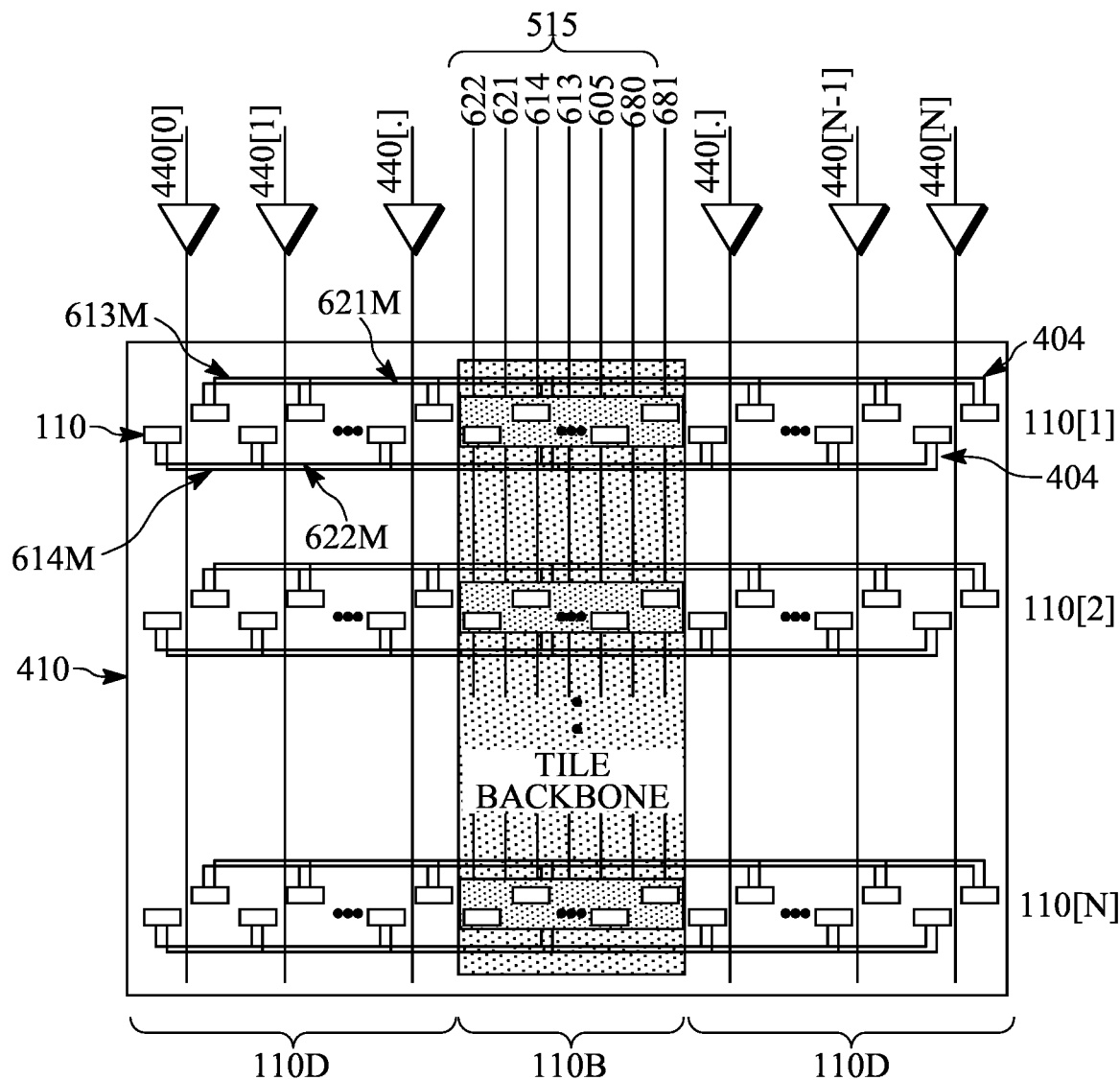
FIG. 5B is schematic top view illustration of a display tile partition of the display of FIG. 5A from a data and configuration update perspective in accordance with an embodiment.

FIG. 5A is schematic top view illustration of a tile-based display including tile backbones 402 of hybrid pixel driver chips that serve as row drivers in accordance with an embodiment. FIG. 5B is schematic top view illustration of a display tile partition of the display of FIG. 5A from a data and configuration update perspective in accordance with an embodiment. The display in accordance with embodiments may include a display panel including a plurality of tiles 410. The tiles 410 may be formed from the same or multiple display substrates 101. The control circuit 140 of FIG. 1 may be mounted on a printed circuit board 430 connected to the display substrate 101 with a flex circuit, or chip on film 432, for example. Bus columns 515 and data lines 440 may extend from the control circuit to the display substrate 101. Column drivers 430 may optionally be located on the display substrate 101 to buffer the global signal lines in the bus columns 515 and/or data lines 440. Each tile 410 may include one or more bus columns 515 of global signal lines, a plurality of rows 404 of row function signal lines, and a plurality of rows of pixel driver chips 110, with each row of pixel driver chips 110 connected to a corresponding row 404 of row function signal lines. Additionally, each pixel driver chip 110 is connected to corresponding matrices 102 of LEDs 104 as described with regard to FIGS. 1-3.

As shown in FIG. 5B, each row of pixel driver chips 110 includes a group of backbone hybrid pixel driver chips 110B and a group of LED driving pixel driver chips 110D. The routing of the bus columns 515 and backbone hybrid pixel driver chips 110B may form a backbone 402 of the tiles 410. Each of the backbone hybrid pixel driver chips 110B and LED driving pixel driver chips 110D may be hybrid pixel driver chips, only configured differently for different function. Alternatively, chips 110B, 110D may have different internal circuitries. The backbone hybrid pixel driver chips 110B and LED driving pixel driver chips 110D may additionally be connected differently. In accordance with embodiments, each of the backbone hybrid pixel driver chips 110B and LED driving pixel driver chips 110D are connected to corresponding matrices 102 of LEDs 104 as described with regard to FIGS. 1-3.

In accordance with embodiments, the bus column 515 of global signal lines is coupled to the group of backbone hybrid pixel driver chips 110B for each row of pixel driver chips 110 and each separate backbone hybrid pixel driver chip 110B includes an input connected to a corresponding global signal line (e.g. 622, 621, 614, 613, 605, 680, 681) and an output connected to a corresponding row function signal line (e.g. 613M, 614M) within a corresponding row 404 of row function signal lines to transmit a corresponding repeat global signal to the corresponding row of pixel driver chips 110.

As shown specifically in FIG. 5B, and described in further detail in the following description, exemplary global signal lines forming the bus columns 515 may include global data clock_0 622, global data clock_1 621, hybrid driver configuration update_0 614, global configuration update_1 613, vertical selection token (VST) 605, vertical selection token scan clock 680, and vertical selection token row capture clock 681, amongst others. In this context, distinction of signal lines 0/1 is made due to adjacent pairs of pixel driver chips 110 sharing a common data 440 line. Thus, the same data signals may be sent to two pixel driver chips 110 within the same row, with the global signal lines used to distinguish the pair. In particular, the backbone hybrid pixel driver chips 110B in accordance with embodiments are configured to receive a specified global signal, and then transmit a manipulated row function signal (e.g. the global signal is manipulated to form the manipulated row function signal) to a corresponding row 404 of row function signal lines that is coupled to the corresponding row of hybrid pixel driver chips 110, including the plurality of LED driving pixel driver chips 110D and one or more of the other backbone hybrid pixel driver chips 110B within the row of pixel driver chips.

Figure 6:
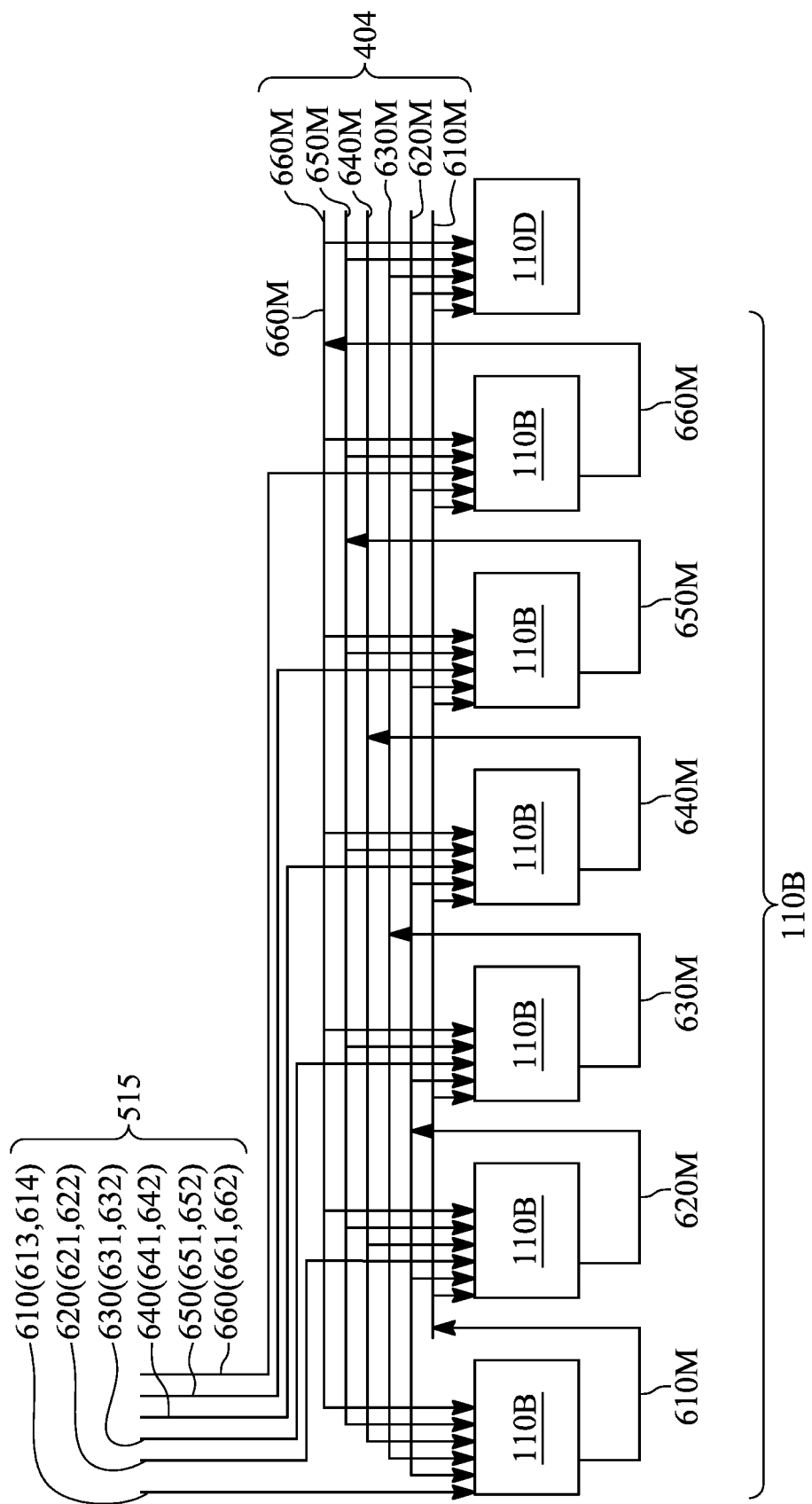
FIG. 6 is a routing diagram of row-function partitioning within a hybrid pixel driver chip backbone in accordance with an embodiment.

FIG. 6 is a routing diagram of row-function partitioning within a hybrid pixel driver chip backbone in accordance with an embodiment. It is to be appreciated, the connections illustrated in FIG. 6 illustrate general high level partitioning, and actual implementations may be more complex. As shown, the bus column 515 of global signal lines may include a global configuration update 610, global data clock 620, global emission row synchronization 630, and global emission frame synchronization 640. Global emission clock lines may also be included. Additionally, emission clocks may be combined for different color emitting LEDs in some embodiments, though this is not required. For example, there may be a global emission clock red 650 and global emission clock blue-green 660. A respective backbone hybrid pixel driver chip 110B may then transmit a manipulated row signal 610M-660M to the corresponding row 404 of row signal lines. These manipulated row signals 610M-660M may be transmitted so some or all of the other backbone hybrid pixel driver chips 110B, as well as to the LED driving pixel driver chips 110D in the corresponding row of pixel driver chips 110. As will become apparent in the following detailed examples, the global signal lines may additionally include odd/even indices 1/0 or primary/redundant signal lines.

Figure 7:
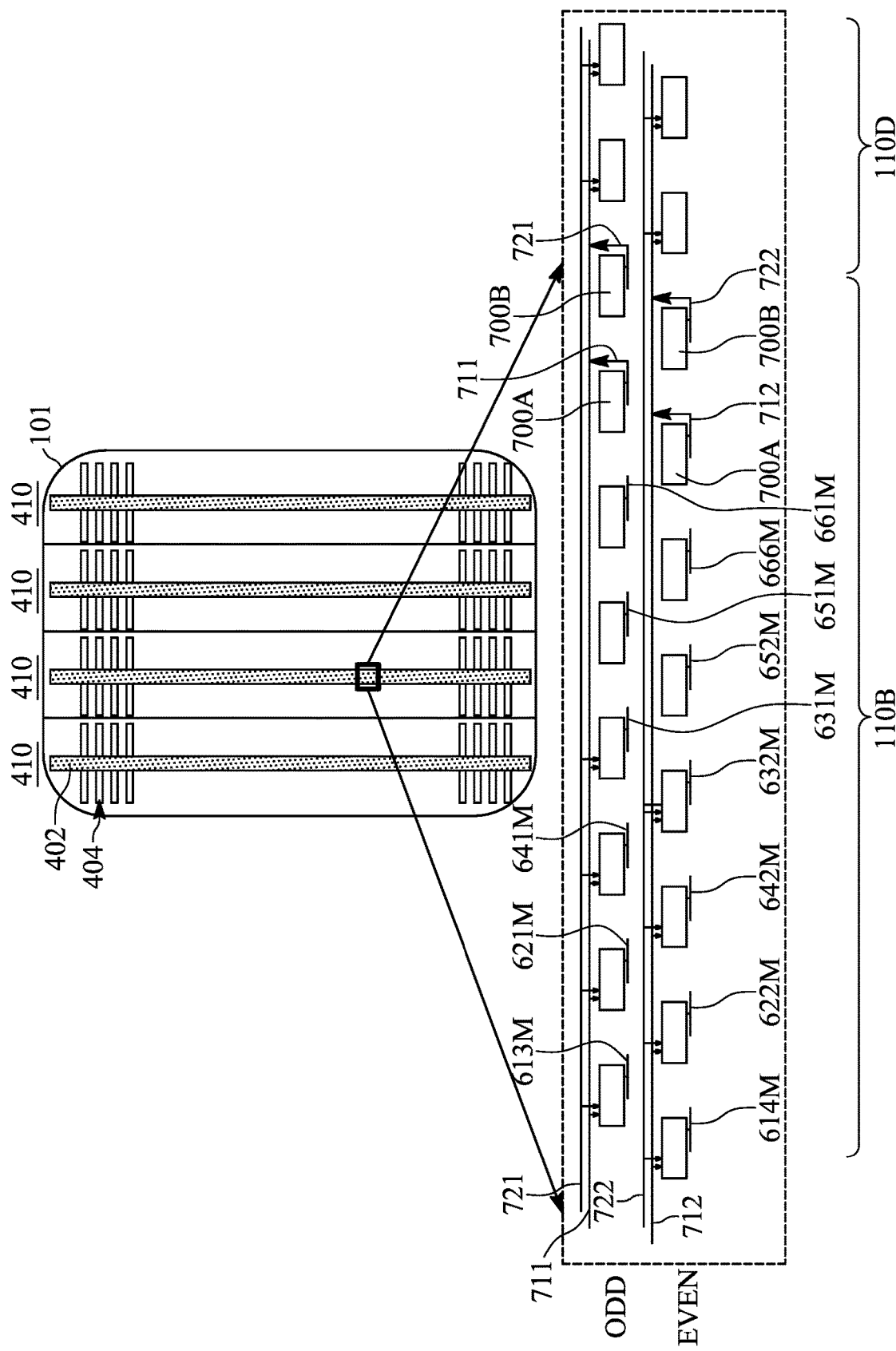
FIG. 7 is a layout diagram of row control signal redundancy and backup within a hybrid pixel driver chip backbone in accordance with an embodiment.

FIG. 7 is a layout diagram of row control signal redundancy and backup within a hybrid pixel driver chip backbone in accordance with an embodiment. As shown, the row of hybrid pixel driver chips 110, and row 404 of row signal lines may be partitioned into odd and even indices to provide for control signal redundancy, and backup in the event of a faulty backbone hybrid pixel driver chip 110B. For example, the staggered arrangement of pixel driver chips 110 can include an odd partition (e.g. upper chips), and an even partition (e.g. lower chips). The bus column 515 may include a partition of global signal lines including global hybrid driver configuration update 0/1 (614, 613), global data clock 0/1 (622, 621), global emission row synchronization 0/1 (632, 631), global emission frame synchronization 0/1 (642, 641), global emission clock red 0/1 (652, 651), and global emission clock blue/green 0/1 (662, 661). The backbone may additionally include one or more backup hybrid pixel driver chips 700A, 770B. In an embodiment, the global hybrid driver configuration update 610 is input to backup hybrid pixel driver chips 700A, with the global data clock 620 input to backup hybrid pixel driver chips 700B. The additional global signals 630, 640, 650, 660 may be input to both backup hybrid pixel driver chips 700A, 700B.

As illustrated in FIG. 7, the backup hybrid pixel driver chips 700A, 700B output manipulated backup signal lines 711, 712, 721, 722 to the partitioned row 404 and row of hybrid pixel driver chips. The manipulated backup signal lines 711, 712, 721, 722 may be connected to inputs of the backbone hybrid pixel driver chips configured for configuration update, data clock, frame synchronization, and row synchronization functions. In operation the backup hybrid pixel driver chips 700A, 700B use the token to initialize their multiplexer output (e.g. modified signal). Backup input pins are added to the backbone hybrid pixel driver chips configured for row function (configuration update, data clock, frame synchronization, row synchronization) to know whether any of the backup hybrid pixel driver chips 700A, 700B are active, and provide the modified row function signals to the row. In the embodiment illustrated, the manipulated backup signal lines 711, 712, 721, 722 are not input to the hybrid pixel driver chips configured for emission clock functions. In accordance with embodiments, the backup hybrid pixel driver chips 700A, 700B can be programmed as either an LED driving pixel driver chip, or to perform the function of a faulty backbone hybrid pixel driver chip within the same backbone row.

Figure 8:
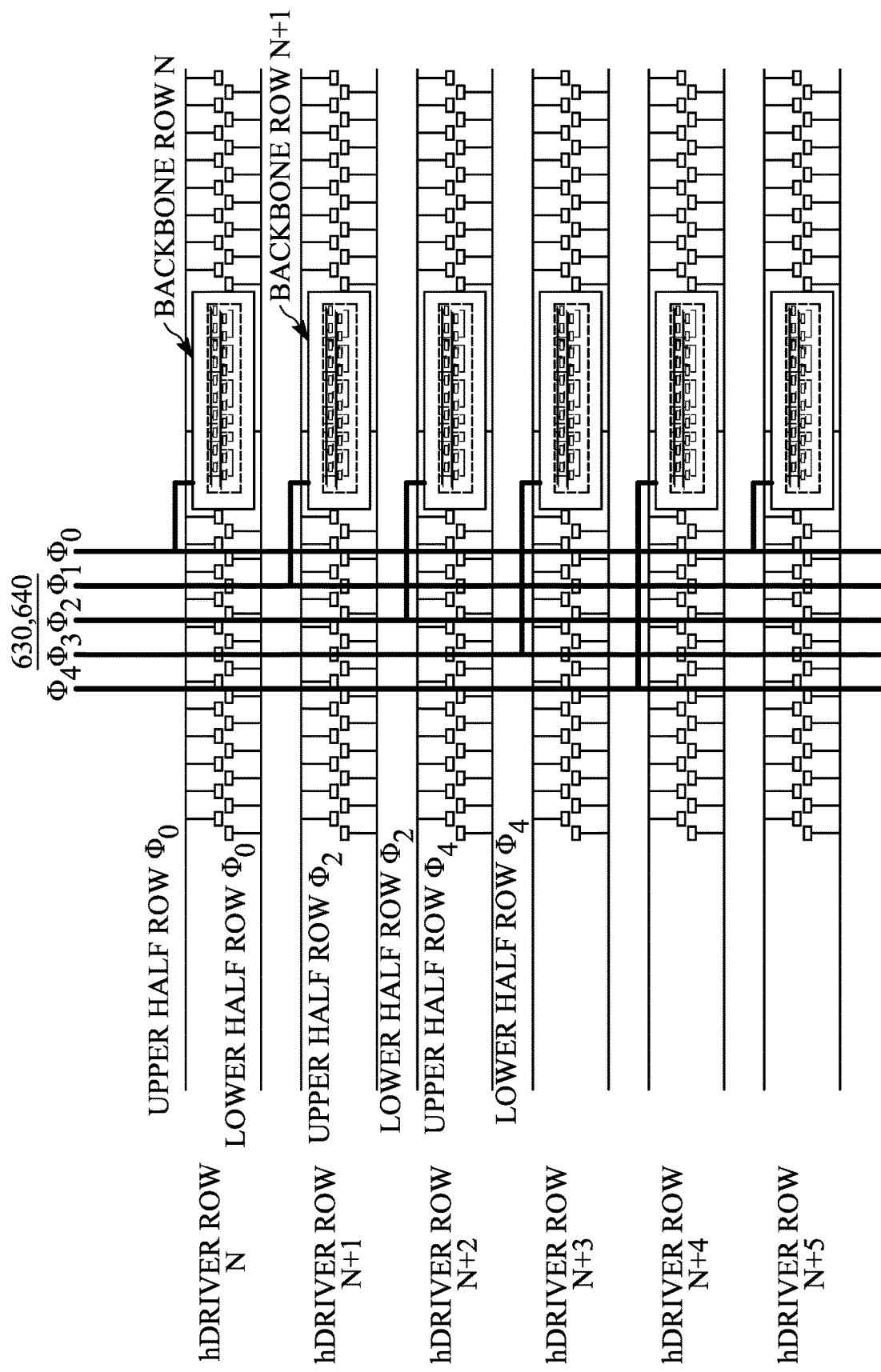
FIG. 8 is a routing diagram of emission frame synchronization and emission row synchronization buffering within rows of pixel driver chips in accordance with an embodiment.

FIG. 8 is a routing diagram of emission frame synchronization and emission row synchronization buffering within rows of pixel driver chips in accordance with an embodiment. As shown, the global emission row synchronization 630 and global emission frame synchronization 640, in addition to optionally being partitioned as described above, may be separated into multiple phases. Five phases Φ0-Φ4 are illustrated, though this is exemplary and embodiments are not limited to a specific number of phases. In the particular embodiment illustrated, each 5th row shares the same phase.

Figure 9:
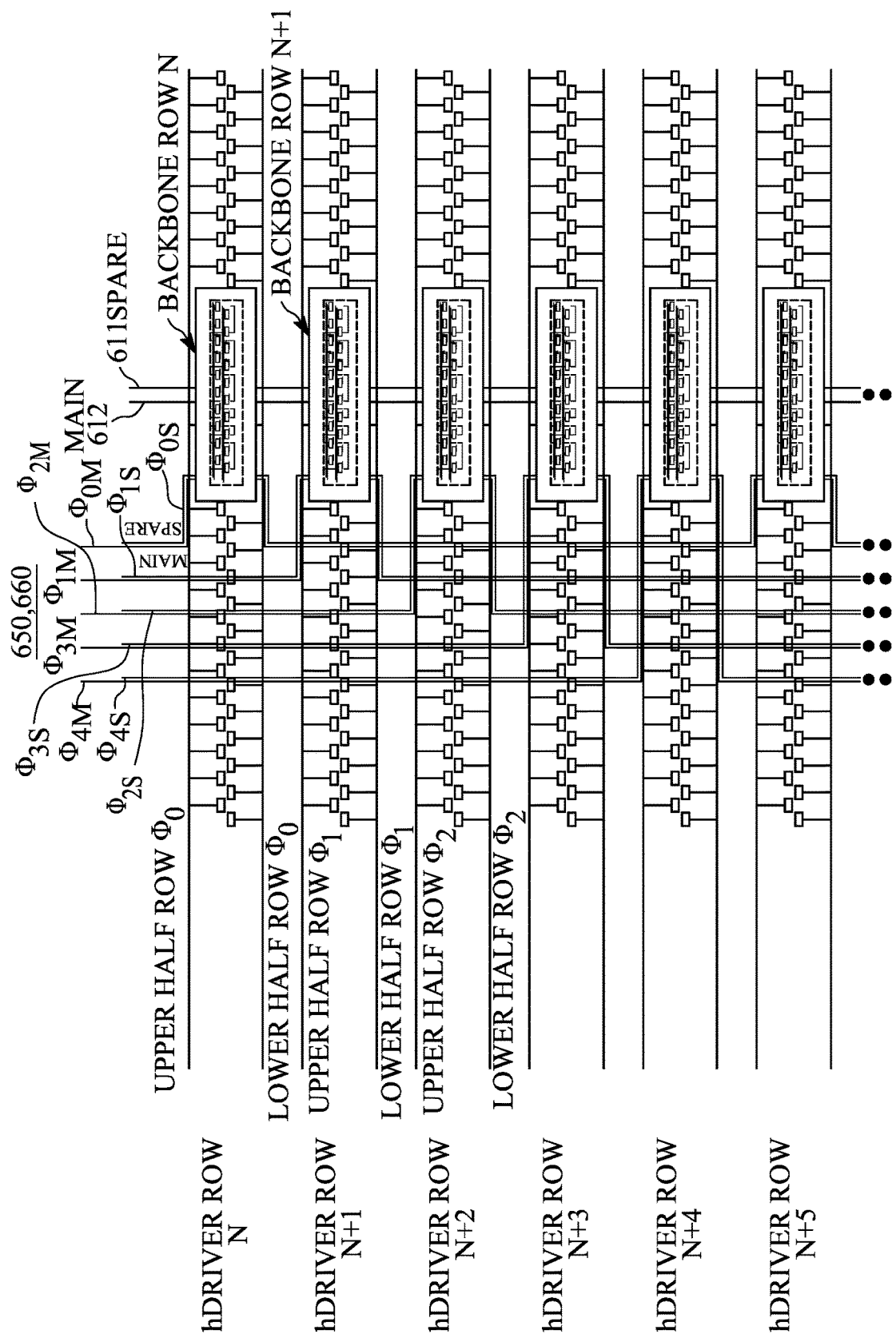
FIG. 9 is a routing diagram of vertical signal redundancy and emission clock vertical and horizontal buffering in accordance with an embodiment.

FIG. 9 is a routing diagram of vertical signal redundancy and emission clock vertical and horizontal buffering in accordance with an embodiment. As shown, the global emission clocks 650, 660, in addition to optionally being partitioned as described above, maybe separated into multiple phases similar to the global emission row synchronization 630 and global emission frame synchronization 640. The exemplary embodiment illustrated in FIG. 9 provides row partitioning with main/spare functions. For example, the odd partition (e.g. 1) may function as a spare, with the even partition (e.g. 0) functioning as the main. In this manner, the backbone hybrid pixel driver chip 110B function may be determined by which odd/even chip in a row has the token. This may be determined by VST inputs, VST_0 612 (main) and VST_1 611 (spare). As described in more detail in the following description, the global emission clocks 650, 660 are repeated by the backbone hybrid pixel driver chips.

Figure 10:
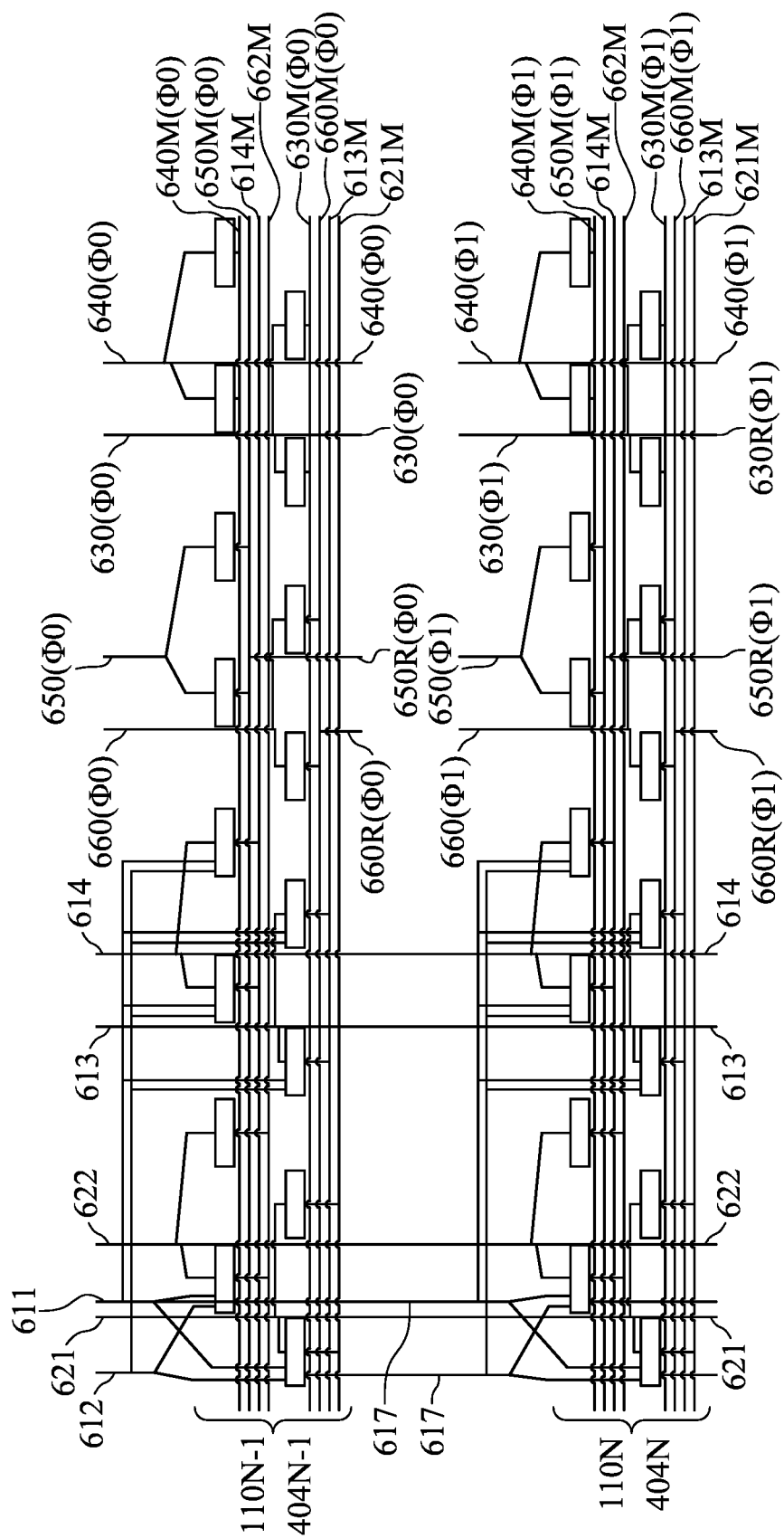
FIG. 10 is a routing diagram of backbone routing of global signal lines to rows of hybrid pixel driver chips and row signal lines in accordance with an embodiment.

Referring now to FIG. 10 a routing diagram is provided of backbone routing of global signal lines to rows of backbone hybrid pixel driver chips and row signal lines in accordance with an embodiment. The exemplary layout provided in FIG. 10 combines several features in accordance with embodiments. As shown, separate phases (Φ0, Φ1) of global emission row synchronization 630 and global emission frame synchronization 640 signals are sent to different rows (N-1, N). Additionally, separate phases (Φ0, Φ1) of global emission clock red 650 and global emission clock blue-green 660 signals are sent to different rows (N-1, N). As shown, repeat emission clock red and emission clock blue/green signal lines 650R, 660R are output from the corresponding backbone hybrid pixel driver chips to the next row (e.g. every 5th row). It is noted the particular connections for global signal lines 630, 640, 650, 660 are different than previously described an illustrated, though either configuration is possible with combinations of embodiments. Specifically, the corresponding backbone hybrid pixel driver chips connected to the global signal lines 630, 640, 650, 660 are partitioned with a pair in either the odd or even section, rather than one chip in each odd and even section.

Still referring to FIG. 10, global hybrid driver configuration update 0/1 (614, 613) and global data clock 0/1 (622, 621) signal lines are input to corresponding pairs of backbone hybrid pixel driver chips. Similarly, VST_0 612 and VST_1 611 signal lines are input to the backbone hybrid pixel driver chips coupled to the global hybrid driver configuration update 0/1 (614, 613) inputs, and at one of each of the backbone hybrid pixel driver chips coupled the global data clock 0/1 (622, 621) signal lines. VST out 617 signal lines are output to both of the backbone hybrid pixel driver chips coupled the global data clock 0/1 (622, 621) signal lines in the next row (N). VST out 617 signal lines are also repeat signal lines, which taken together will repeat VST_0 612 and VST_1 611 signal lines to the next row.

With the particular configuration illustrated in FIG. 10, the data clock and hybrid pixel driver configuration update are separately created for each row partition 0/1. In this particular illustration, the partition of 0/1 corresponds to right/left as opposed to bottom/top (even/odd). In other embodiments, the partition 0/1 corresponds to bottom/top (even/odd) as previously described. Each hybrid pixel driver chip row buffers the emission clock red, emission clock blue/green, emission frame synchronization, and emission row synchronization for its associated clock phase. However, embodiments are not limited to this particular configuration, and each of the global signal lines may be separately created for each row partition 0/1.

Figure 11:
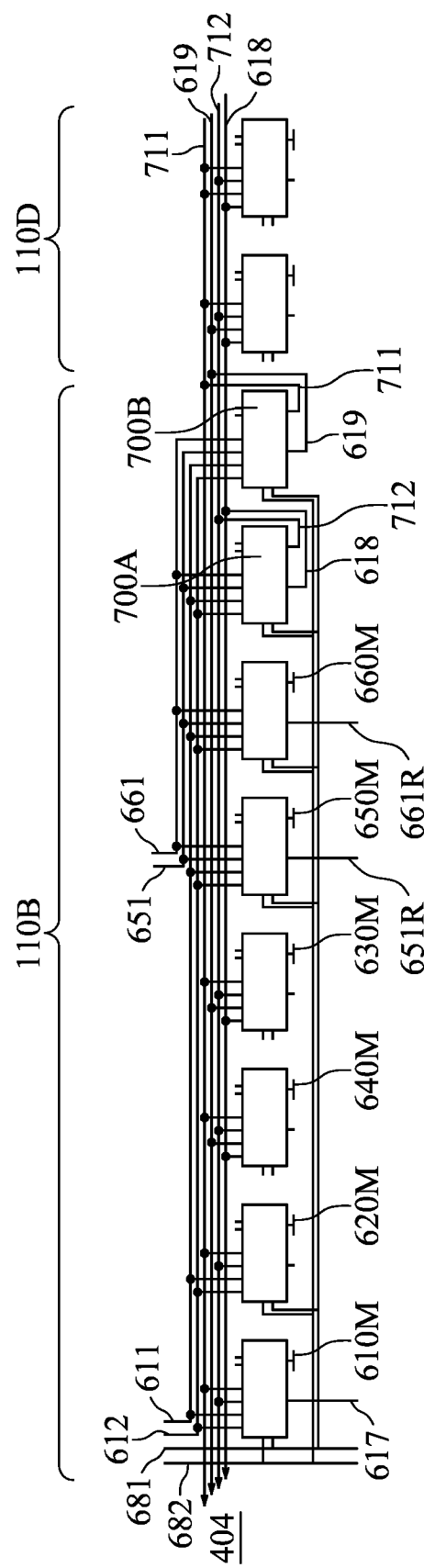
FIG. 11 is a routing diagram of horizontal control signal redundancy for VST and backup line connection in accordance with an embodiment.

FIG. 11 is a routing diagram of horizontal control signal redundancy for VST and backup line connection in accordance with an embodiment. Among the select global signal lines included in FIG. 11 are VST scan clock 682, and VST row capture clock 681, emission clock red_1 651 (spare), and emission clock green/blue_1 661 (spare). Thus, in this circumstance, the row partition 0/1 for the emission clock signal lines corresponds to main/spare. As shown, the VST scan clock 682, VST row capture clock 681, as well as VST_0 612 and VST_1 611, are input to the backbone hybrid pixel driver chips that produce the manipulated hybrid driver configuration update 610M, manipulated data clock 620M, manipulated emission clock red 651M (or 650M generally), and manipulated emission clock blue-green 661M (or 660M generally) signals, as well as into the spare backbone hybrid pixel driver chips 700A, 700B. The emission clock red_1 651 (spare), and emission clock green/blue_1 661 (spare) are input to the backbone hybrid pixel driver chips that produce the manipulated emission clock red 651M (or 650M generally), and manipulated emission clock blue-green 661M (or 660M generally) signals, as well as into the spare backbone hybrid pixel driver chips 700A, 700B.

In particular embodiment illustrated, the spare backbone hybrid pixel driver chip 700A outputs are connected to the backup indicator_0 618, and backup line_0 712 within row 404, while spare backbone hybrid pixel driver chip 700B outputs are connected to the backup indicator_1 619, and backup line_0 711 within row 404. The backup indicators (e.g. 618, 619) indicate that the backup lines (e.g. 712, 711) are valid to provide backup functions. Backup indicator_0 618 and backup line_0 712 are used together, and backup indicator_0 619 and backup line_0 711 are used together. In this manner, the spare backbone hybrid pixel driver chips 700A, 700B can be programed to back up a faulty backbone hybrid pixel driver chip originally designed to buffer the global emission clock signals, and transmit the manipulated emission clock signals (e.g. 651, 661 or 650, 660 generally) to the row 404 over the backup line_0 712 or backup line_0 711.

Figure 12:
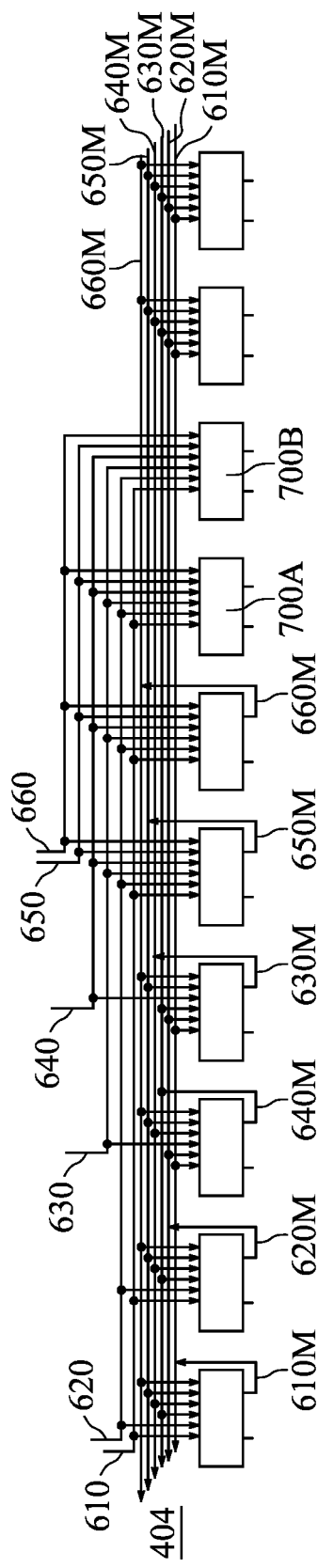
FIG. 12 is a routing diagram of horizontal control signal redundancy for row function signal connections in accordance with an embodiment.

FIG. 12 is a routing diagram of horizontal control signal redundancy for row function signal connections in accordance with an embodiment. Row-function partitioning (or chip partitioning) within a hybrid pixel driver chip backbone in accordance with embodiments entails receiving a global signal with one or more backbone hybrid pixel driver chips 110B, and transmitting a manipulated signal from the one or more backbone hybrid pixel driver chips 110B to one or more other backbone hybrid pixel driver chips, and the associated group of LED driving pixel driver chips 110D within the corresponding row.

A specific global signal may be directly received by a plurality of the backbone hybrid pixel driver chips 110B, while the manipulated signal is produced by a specified backbone hybrid pixel driver chip 110B of the plurality, or alternatively by a spare backbone hybrid pixel driver chip 700A, 700B. In the embodiment illustrated in FIG. 12, the global hybrid driver configuration update 610 and global data clock 620 signal lines are input the respective backbone chips for which a manipulated signal is generated, as well as for the backbone chips that are programmed to modify the global emission clocks (e.g. 650, 660), and spare chips (e.g. 700A, 700B). Similarly, the global emission row synchronization 630 and global emission frame synchronization 640 signal lines are input to the respective backbone chips for which a manipulated signal is generated, as well as for the backbone chips that are programmed to modify the global emission clocks (e.g. 650, 660), and spare chips (e.g. 700A, 700B). Additionally, as described with regard to FIG. 11, the global emission clock red 650 and global emission clock blue-green 660 signal lines are input to the respective backbone chips for which a manipulated signal is generated, as well as for the spare chips (e.g. 700A, 700B).

In an embodiment, a display panel includes a bus column 515 of global signal lines, a plurality of rows 404 of row function signal lines, and a plurality of rows [1 . . . N] of pixel driver chips 110, each row of pixel driver chips connected to a corresponding row 404 of row function signal lines, each pixel driver chip connected to a corresponding matrix 102 of light emitting diodes (LEDs) 104. Each row of pixel driver chips can include a group of backbone hybrid pixel driver chips 110B and a group of LED driving pixel driver chips 110D. The bus column 515 of global signal lines is coupled to the group of backbone hybrid pixel driver chips 110B for each row of pixel driver chips and each separate backbone hybrid pixel driver chip includes an input connected to a corresponding global signal line and an output (e.g. 1450M, FIG. 14) connected to a corresponding row function signal line within a corresponding row of row function signal lines to transmit a corresponding manipulated signal to the corresponding row of pixel driver chips.

The following exemplary implementation is directed to data clock and configuration update routing. In an embodiment, each group of backbone hybrid pixel driver chips 110B includes a data clock backbone hybrid pixel driver chip with an input coupled with a global data clock 620 signal line, and an output coupled with a corresponding row function signal line to transmit a manipulated data clock 620M signal to the corresponding row of pixel driver chips. Each group of backbone hybrid pixel driver chips may also include a configuration update backbone hybrid pixel driver chip with an input coupled with a global configuration update 610 signal line, and an output coupled with a corresponding row function signal line to transmit a manipulated configuration update 610M signal to the corresponding row of pixel driver chips. In an embodiment, the data clock backbone hybrid pixel driver chip includes an input coupled with the global configuration update 610 signal line, and the configuration update backbone hybrid pixel driver chip includes an input coupled with the global data clock 620 signal line.

The following exemplary implementation is directed to VST routing and backup chips. In an embodiment, each group of backbone hybrid pixel driver chips includes a backup backbone hybrid pixel driver chip 700A, 700B, where the backup backbone hybrid pixel driver chip 700A, 700B includes an input coupled with the global configuration update 610 signal line and an input coupled with the global data clock 620 signal line. A VST clock line (e.g. VST scan clock 682, VST row capture clock 681) may be coupled to inputs of the data clock backbone hybrid pixel driver chip, the configuration update backbone hybrid pixel driver chip, and the backup backbone hybrid pixel driver chip. The backup backbone hybrid pixel driver chip may also include an output coupled with a corresponding row function signal line to transmit a manipulated row function signal to the corresponding row of pixel driver chips, including the data clock backbone hybrid pixel driver chip and the configuration update backbone hybrid pixel driver chip.

The following exemplary implementation covers another routing, such as that for synchronization. In an embodiment, each group of backbone hybrid pixel driver chips includes a first backbone hybrid pixel driver chip with an input coupled with a first global signal line, and a first output coupled with a corresponding first row function signal line to transmit a first manipulated signal to the corresponding row of pixel driver chips, and a second backbone hybrid pixel driver chip with an input coupled with a second global signal line, and a second output coupled with a corresponding second row function signal line to transmit a second manipulated signal to the corresponding row of pixel driver chips. In an embodiment, the second row function signal line is coupled to a third input of the first backbone hybrid pixel driver chip, and the first row function signal line is coupled to a fourth input of the second backbone hybrid pixel driver chip. For example, the first global signal line may be a global emission row synchronization 630 line, and the second global signal line may be a global emission frame synchronization 640 line.

The display panel may distribute global row function signals among the backbone hybrid pixel driver chips so that each backbone hybrid pixel driver chip is responsible for manipulating and/or repeating a specified global row function signal. In an embodiment, each group of backbone hybrid pixel driver chips includes a data clock backbone hybrid pixel driver chip with an input coupled with a global data clock 620 signal line and a global configuration update 610 signal line, a configuration update backbone hybrid pixel driver chip with an input coupled with the global data clock signal 620 line and the global configuration update 610 signal line, a frame synchronization backbone hybrid pixel driver chip with an input coupled with a global frame synchronization 630 signal line, a row synchronization backbone hybrid pixel driver chip with an input coupled with a global row synchronization 640 signal line, and an emission clock backbone hybrid pixel driver chip with an input coupled with a global emission clock (e.g. 650, 660) signal line. Each group of backbone hybrid pixel driver chips may additionally include one or more backup backbone hybrid pixel driver chips 700A, 700B coupled with the global data clock 620 signal line, the global configuration update 610 signal line, the global frame synchronization 630 signal line, the global row synchronization signal 640 line, and the global emission clock (e.g. 650, 660) signal line.

Figure 13:
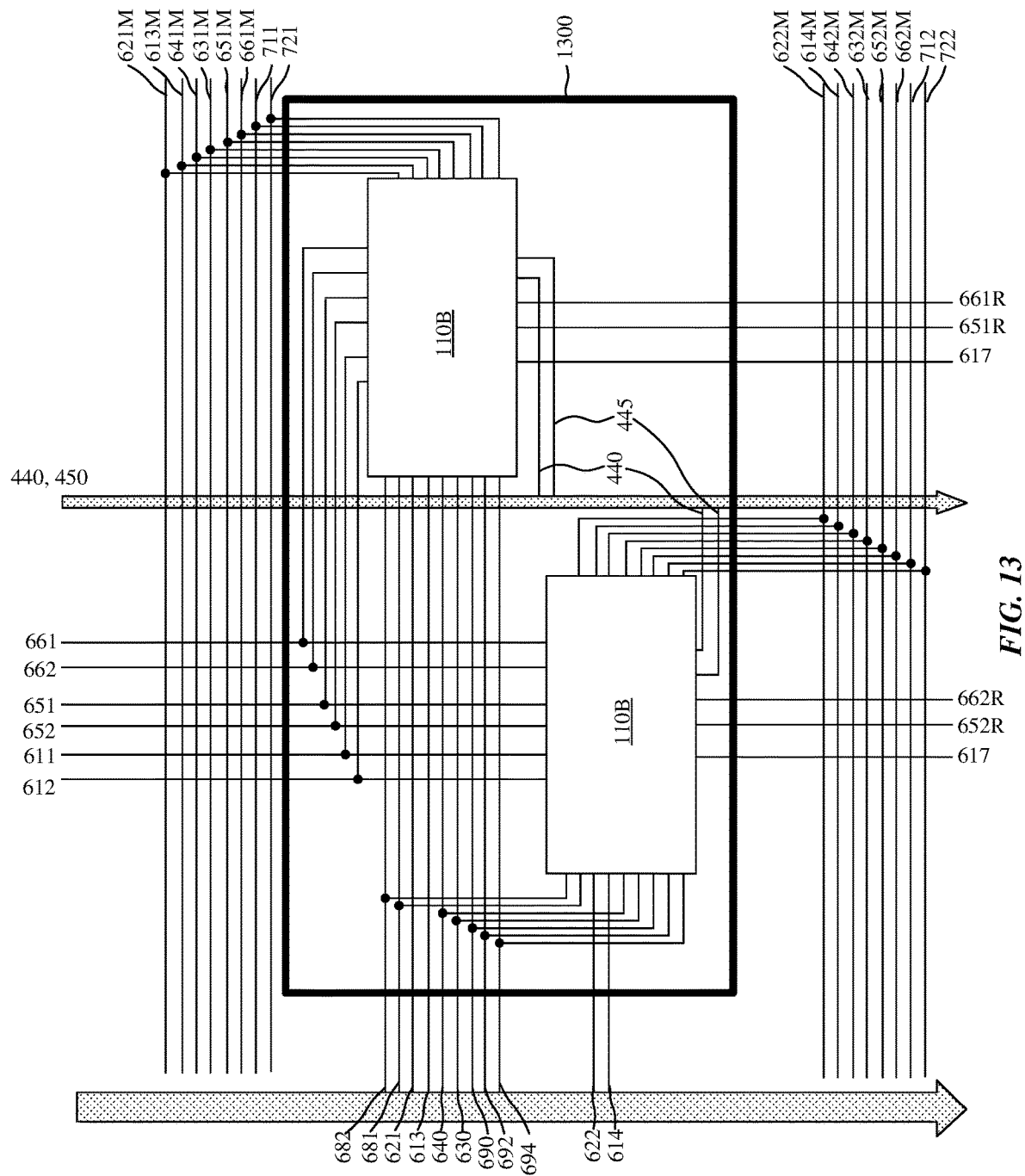
FIG. 13 is a routing diagram of global signal lines and row signal lines connections to and from the backbone of a tile-based display panel in accordance with an embodiment.

FIG. 13 is a routing diagram of global signal lines and row signal lines connections to and from the backbone of a tile-based display panel in accordance with an embodiment. In particular, the routing diagram illustrates global signal line inputs, and (manipulated) outputs from odd/even indices of group of backbone hybrid pixel driver chips 110B to odd/even routing within a row 404 of row signal lines, as well as repeat outputs to the next row. At a high level, FIG. 13 provides inputs for the odd/even indices of a row of backbone hybrid pixel driver chips. Thus, annotation of 110B illustrates the entire backbone row of backbone hybrid pixel driver chips 110B. Taken together, FIG. 13 illustrates high level connections to a backbone row 1300 of odd/even indices of backbone hybrid pixel driver chips 110B. As shown, several global signals (which may be digital) are input to both odd/even groups of backbone hybrid pixel driver chips including VST scan clock 682, VST row capture clock 681, emission frame synchronization 640, and emission row synchronization 630. Additional signal lines, not previously discussed include a hybrid pixel driver chip reset 690, token reset 692, and design for test control 694 signal line. Global data clock_1 621, and global configuration update_1 613 signal lines are input to only the odd indices backbone hybrid pixel driver chips, while global data clock_0 622 and global configuration update_0 614 are input to only the even indices backbone hybrid pixel driver chips.

Additionally, data signals are input into each of the odd/even groups of backbone hybrid pixel driver chips including data 440, and configuration update 445 signal lines.

In addition, there are several vertically repeating global signals (e.g. digital) that are input to both odd/even groups of backbone hybrid pixel driver chips including VST_0 (main) 612, VST_1 (spare) 611, emission clock red_0 (main) 652, emission clock red_1 (spare) 651, emission clock blue-green_0 (main) 662, and emission clock blue-green_1 (spare) 661. Outputs from the odd/even indices of the backbone hybrid pixel driver chips 110B include repeat emission clock blue-green 662R, repeat emission clock red 652R, repeat emission clock blue-green 661R, repeat emission clock red 651R, and VST out 617.

In the embodiment, outputs from the odd indices of the backbone hybrid pixel driver chips 110B include manipulated data clock_1 621M, manipulated configuration update_1 613M, manipulated emission frame synchronization_1 641M, manipulated emission row synchronization_1 631M, manipulated emission clock red_1 651M, manipulated emission clock blue-green_1 661M, backup line_1 711, and backup line_3 721.

In the embodiment, outputs from the even indices of the backbone hybrid pixel driver chips 110B include manipulated data clock_0 622M, manipulated configuration update_0 614M, manipulated emission frame synchronization_0 642M, manipulated emission row synchronization_0 632M, manipulated emission clock red_0 652M, manipulated emission clock blue-green_0 662M, backup line_0 712, and backup line_2 722.

Figure 14:
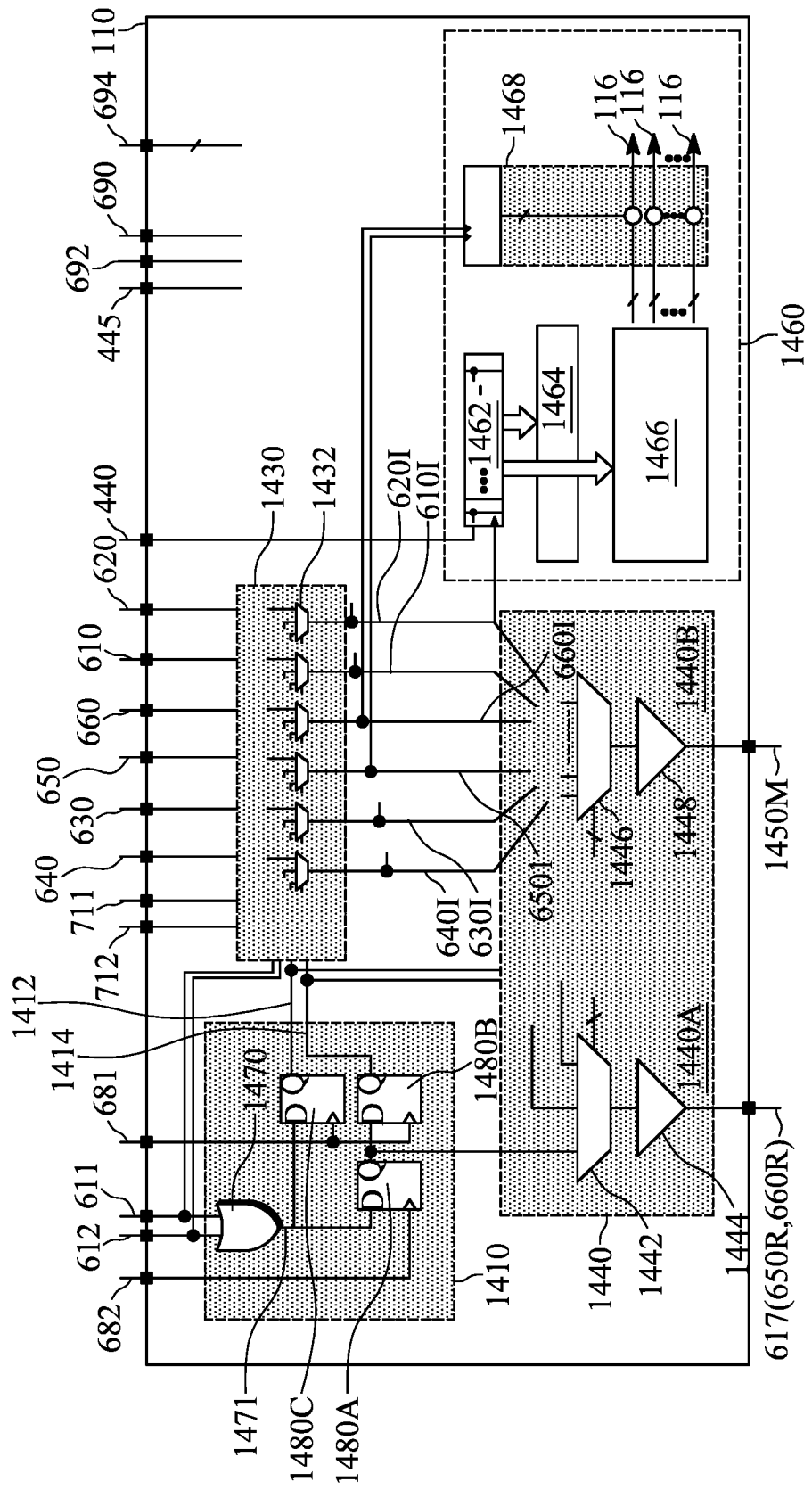
FIG. 14 is a block circuit diagram for a backbone hybrid pixel driver chip in accordance with an embodiment.

FIG. 14 is a block circuit diagram for a backbone hybrid pixel driver chip in accordance with an embodiment. In the embodiment illustrated, the backbone hybrid pixel driver chip includes a VST driver circuitry 1410, a signal modulator circuitry 1430, multiplexer driver circuitry 1440, and an LED driving circuitry 1460.

The LED driving circuitry 1460 portion provides emitting function for the hybrid pixel driver chips and stores the pixel data and configuration data. The LED driving circuitry 1460 portion includes a shift register 1462, latches 1464, memory 1466, and emission clock counter 1468. At least data 440 signals and internal data clock 620I are input to the shift register 1462, and at least internal emission clock red 650I and internal emission clock blue-green 660I are input to the emission clock counter 1468 to output emission pulses at output drivers 116. However, prior to emitting, need to configure the hybrid pixel driver chips for row function.

The VST driver circuitry 1410 determines whether this row is on or off, and provides VST propagation from top to bottom of the display panel. The actual token hybrid pixel driver chips receive the global VST signals, while other hybrid pixel driver chips receive VST signals from the backup hybrid pixel driver chips. As shown, the VST driver circuitry 1410 includes inputs for the VST scan clock 682, VST row capture clock 681, VST_0 612 and VST_1 611, and outputs for a token latch 1414 signal and token 1412 signal. The token latch 141, token 1412, VST_0 612, and VST_1 611 signals are input into a signal modulator 1430.

Specifically, the VST driver circuitry 1410 includes an OR gate 1470 coupled to VST inputs 611, 612, and a plurality of flip-flop circuits 1480 coupled to the VST clock inputs 681, 682 and an output 1771 from the OR gate, the plurality of flip-flop circuits 1480 including the token 1412 output and a token latch 1414 output. In operation, the OR gate 1470 outputs a HIGH output 1771 signal if one or both the inputs to the gate are HIGH (1). If neither input is high, a LOW output (0) results. With regard to the flip-flop circuits 1480, when the VST clock input (e.g. 681 or 682) is LOW, output is LOW. When the VST clock input (e.g. 681 or 682) is HIGH, the flip-flop circuit output is HIGH (1) if the data input is HIGH (1), and the output is LOW (0) if the data output is LOW (0).

Specifically, the output of the OR gate 1470 is coupled to data inputs of flip-flop circuits 1480A, 1480C. One VST clock (e.g. VST scan clock 682) is coupled to a clock input of flip-flop circuit 1480A. Another VST clock (e.g. VST row capture clock 681) is coupled to a clock input of flip-flop circuits 1480C, 1480B. The data output from flip-flop circuit 1480A is coupled to the data input for flip flop circuit 1480B, and anode from the data output from flip-flop circuit 1480A is also coupled to a multiplexer 1442 within the multiplexer driver circuitry 1440. Token 1412 is coupled to the data output of flip-flop circuit 1480C, and token latch 1414 is coupled to the data output of flip-flop circuit 1480B.

If the VST driver circuitry 1410 outputs that the row is on, the signal modulator circuitry 1430 selects whether to take the global row function signals or backup lines for any of the row functions. The token latch 1414 and token 1412 are different phases, and in combination with VST_0 612 and VST_1 611 tell whether to use either of the backup lines 711, 712 for any of the row function signals 610, 620, 630, 640, 650, 660. Additionally, the signal modulator circuitry 1430 modifies the global input signals to manipulated signals specific to the particular row. A plurality of multiplexers 1432 output internal (manipulated) row function signals from the signal modulator 1430 to a multiplexer driver 1440 and the LED driving circuit 1460. Included outputs may be internal configuration update 610I, internal data clock 620I, internal remission row synchronization 630I, internal emission frame synchronization 640I, internal emission clock red 650I, and internal emission clock blue-green 660I.

The multiplexer driver circuitry 1440 includes two portions, namely a repeater portion 1440A and row function output portion 1440B. Outputs from the VST driver circuitry 1410 are input to a multiplexer 1442 of the repeater portion 1440A, followed by buffering with buffer 1444, to output VST_out 617. Internal emission clocks can also be input to the multiplexer 1442, to alternatively output repeat emission clock signals such as repeat emission clock red 650R (651R, 652R) or repeat emission clock blue-green 660R (661R, 662R). Internal row function signals from the signal modulator circuitry 1430 are input into a multiplexer 1446 of the row function output portion 1440B, followed by buffering with buffer 1448, to output a manipulated multiplexer output 1450M signal (which is a manipulated signal output or repeat signal output for the programmed backbone hybrid pixel driver chip). Thus, the manipulated multiplexer output 1450M may be any of the manipulated output signals, or backup signals previously described, and physically connected to a specified row function line within row 404 depending upon signal. For example, referring to the exemplary embodiment illustrated in FIG. 13, the manipulated multiplexer output 1450M may be connected to any of (621M, 613M, 641M, 631M, 651M, 661M, 711, 721, 622M, 614M, 642M, 632M, 652M, 662M, 712, 722) though other configurations are possible.

In accordance with embodiments, for non-backbone hybrid pixel driver chips VST input terminals 611 and 612 are still connected to the backup indicator signals in order to select the backup signal as one of row function. The scan clock 681 and row capture clock 682 inputs may be tied to ground to indicate they are not backbone hybrid drivers, while VST out 617 and multiplexer out 1450M may be floating. Thus, circuitry may remain the same for the backbone hybrid pixel driver chips 110B and driving hybrid pixel driver chips 110A, with only programming and outside connections being different.

In an embodiment, a hybrid pixel driver chip includes vertical selection token (VST) inputs (e.g. 611, 612), VST clock inputs (e.g. 681, 682), and a VST driver circuitry 1410 coupled to the VST inputs and the VST clock inputs, the VST driver circuitry further including a token 1412 output and a token latch 1414 output. The hybrid pixel driver chip further includes a signal modulator circuitry 1430 coupled to the token 1412 output and the token latch 1414 output, the signal modulator circuitry 1430 further including a plurality of multiplexers 1432 coupled to a plurality of global signal inputs, and a plurality of internal signal outputs from the plurality of multiplexers 1432. The signal modulator circuitry 1430 may also be coupled to the VST inputs (e.g. 611, 612). Additional components of the hybrid pixel driver chip can include a multiplexer driver circuitry 1440 including a multiplexer 1446 coupled with the plurality of internal signal outputs, and a multiplexer output 1450M, and an LED driving circuitry 1460 coupled with a data 440 input and one or more of the plurality of internal signal outputs, the LED driving circuitry 1460 additionally including a plurality of output drivers 116.

In an embodiment, the multiplexer driver circuitry 1440 includes a repeater portion 1440A coupled with the VST driver 1410 and a row function output portion 1440B coupled with the signal modulator 1430.

In an embodiment, the VST driver circuitry 1410 includes an OR gate 1470 coupled to VST inputs (e.g. 611, 612), and a plurality of flip-flop circuits (1480A, 1480B, 1480C) coupled to the VST clock inputs (e.g. 681 or 682) and an output 1471 from the OR gate 1470, the plurality of flip-flop circuits including the token 1412 output and a token latch 1414 output.

Figure 15:
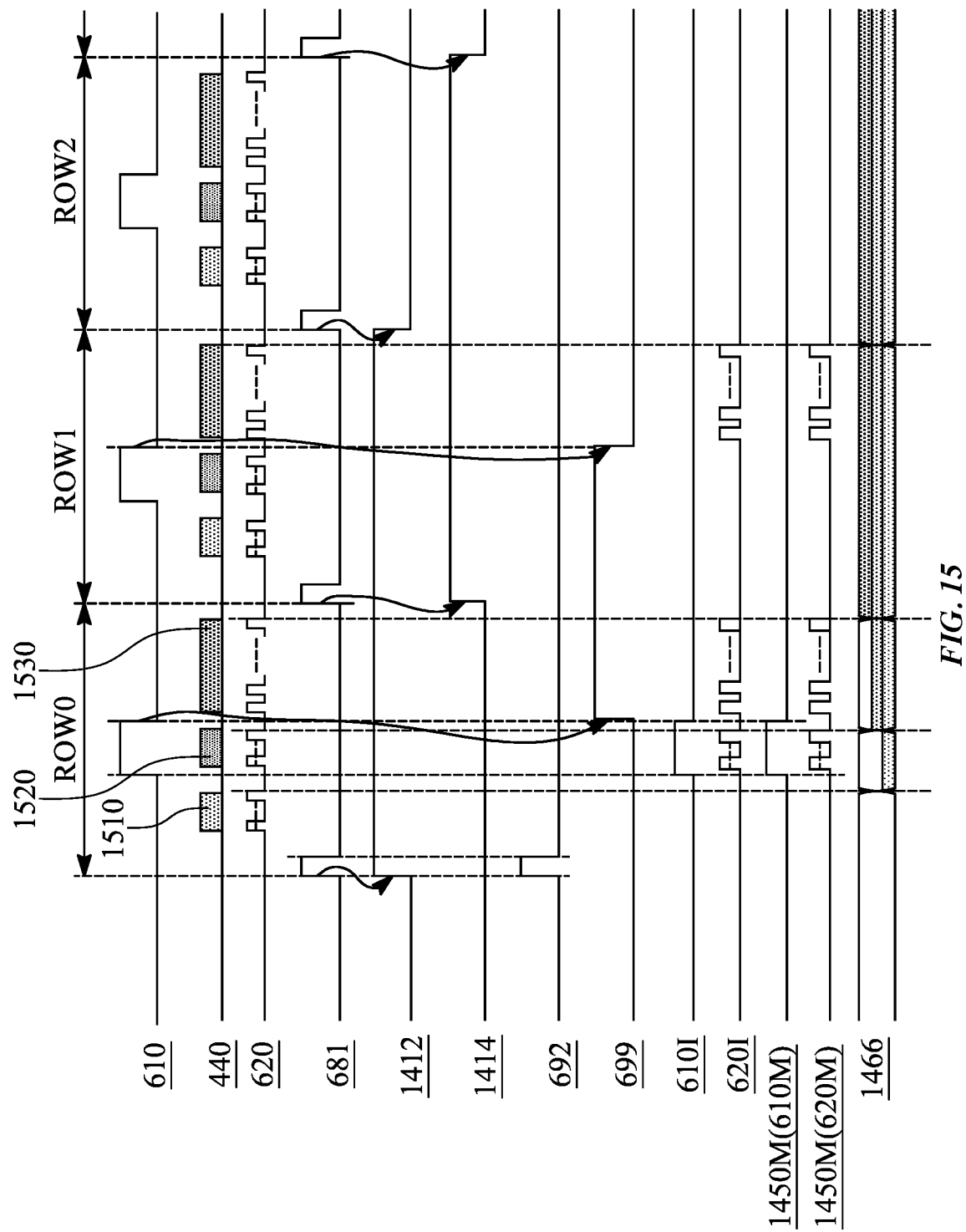
FIG. 15 is a timing diagram for data loading of token activated hybrid pixel driver chips in accordance with an embodiment.

FIG. 15 is a timing diagram for data loading of token activated hybrid pixel driver chips in accordance with an embodiment. Thus, the timing diagram of the embodiment in FIG. 15 is directed to the specific backbone hybrid pixel driver chips that are wired to the VST routing backbone (e.g. as illustrated in FIG. 11). Specifically, the timing diagram of FIG. 15 is directed to the two left-most backbone hybrid pixel driver chips illustrated in FIG. 11 with the global/repeat VST connections.

FIG. 15 illustrates a particular aspect of embodiments in which the specific backbone hybrid pixel driver chips are programmed in two parts. Firstly, the specific backbone hybrid pixel driver chips are configured. Then the specific backbone hybrid pixel driver chips deliver the corresponding multiplexer out 1450M signals, specifically the manipulated configuration update 610M and manipulated data clock 620 signals to the other pixel driver chips connected to the corresponding row 404. Once the row is configured, then the other data bits can be defined. Thus, a method of programming a backbone hybrid pixel driver chip in an embodiment includes a general sequence of activating the token, once the token is high programming the data clock and configuration update so that this row is available (sending manipulated data clock and manipulated configuration update to the rest of the row), followed by writing the rest of the configuration bits.

Three distinct portions of data 440 bits are illustrated in FIG. 15. Token driver configuration 1510 data includes data for optional selection of a backup line 711/712 with signal modulator 1430, and data for manipulating the global data clock 620 and global configuration update 610 signals. This token driver configuration 1510 data is used by only the token activated backbone hybrid pixel driver chips that are hardwired to the VST signal lines. Row driver configuration 1520 data includes data for selection of the other row function signals with the signal modulator 1430, and LED configuration within the row. This row driver configuration 1520 data is used by all backbone hybrid pixel driver chips to transmit manipulated row function signals to the corresponding row 404. LED pixel data 1530 includes data for the LED pixel data slices 0/1 of hybrid pixel driver chips within a corresponding row.

As shown in FIG. 15, initially a token reset 692 signal goes high to reset the backbone hybrid pixel driver chip. Also, the VST row capture clock 681 goes high (leading edge), and the VST driver 1410 generates the high token 1412 signal. At this point, the backbone hybrid pixel driver chip for row0 is token activated and prepared for configuration and data loading. However, prior to loading LED pixel data, the hybrid pixel drivers are first configured. If VST is active at certain row, it tends to high (token). The token follows the global VST clocks (VST scan clock 682, VST row capture clock 681). In this embodiment, VST scan clock 682 and VST row capture clock 681 are the same frequency.

As described, configuration is performed in two parts. First, token driver configuration 1510 data is loaded to configure the specific hardwired backbone hybrid pixel driver chip with for multiplexer selection of backup lines 0/1 712, 711, and for generating the manipulated data clock 620M and manipulated configuration update 610M signals. Backup line configuration is included because it can be used for either manipulated data clock 620M or manipulated configuration update 610M signal. The initial configuration is important because the manipulated data clock 620M and manipulated configuration update 610M signals are needed to identify configuration bits or data bits. Second, row driver configuration 1520 is loaded for multiplexer selection of the other row function signals with multiplexer out 1450M. The particular timing diagram of FIG. 15 is directed to two left-most backbone hybrid pixel driver chips illustrated in FIG. 11 with the global/repeat VST connections. Thus, the multiplexer out 1450M signal lines correspond to the manipulated data clock 620M and manipulated configuration update 610M signals.

As shown, a pulse of the global configuration update 610 signal is applied, and received by the hardwired backbone hybrid pixel driver chips. The corresponding internal data clock 620I and internal configuration update 610I are generated during application of the global configuration update 610 signal, and the manipulated signals (manipulated data clock 620M signal and manipulated configuration update 610M signal) are transmitted to the row through the multiplexer out 1450M signal lines.

The global configuration update 610 signal is then de-asserted (falling edge) which causes a configuration done 699 signal to go high. As also shown, a subsequent falling edge of the global configuration 610 signal causes the configuration done 699 signal to go low. The configuration done 699 signal is an internal signal that allows the hybrid pixel driver chip to distinguish pixel data from configuration data, and therefore write the LED pixel data 1530 to memory 1466. During row1 time, the configuration done 699 signal prohibits configuring the driver with data 1510, because the configuration bits from global data clock 620 are used for the new row (row1) driver. The pixel bits in time row0 and row1 are shared by both drivers in the two rows. Memory 1466 is written up by first few token driver configuration 1510 data bits, then general row driver configuration 1520 data, and then pixel data 1530, following another set of pixel data in row1 time.

Figure 16:
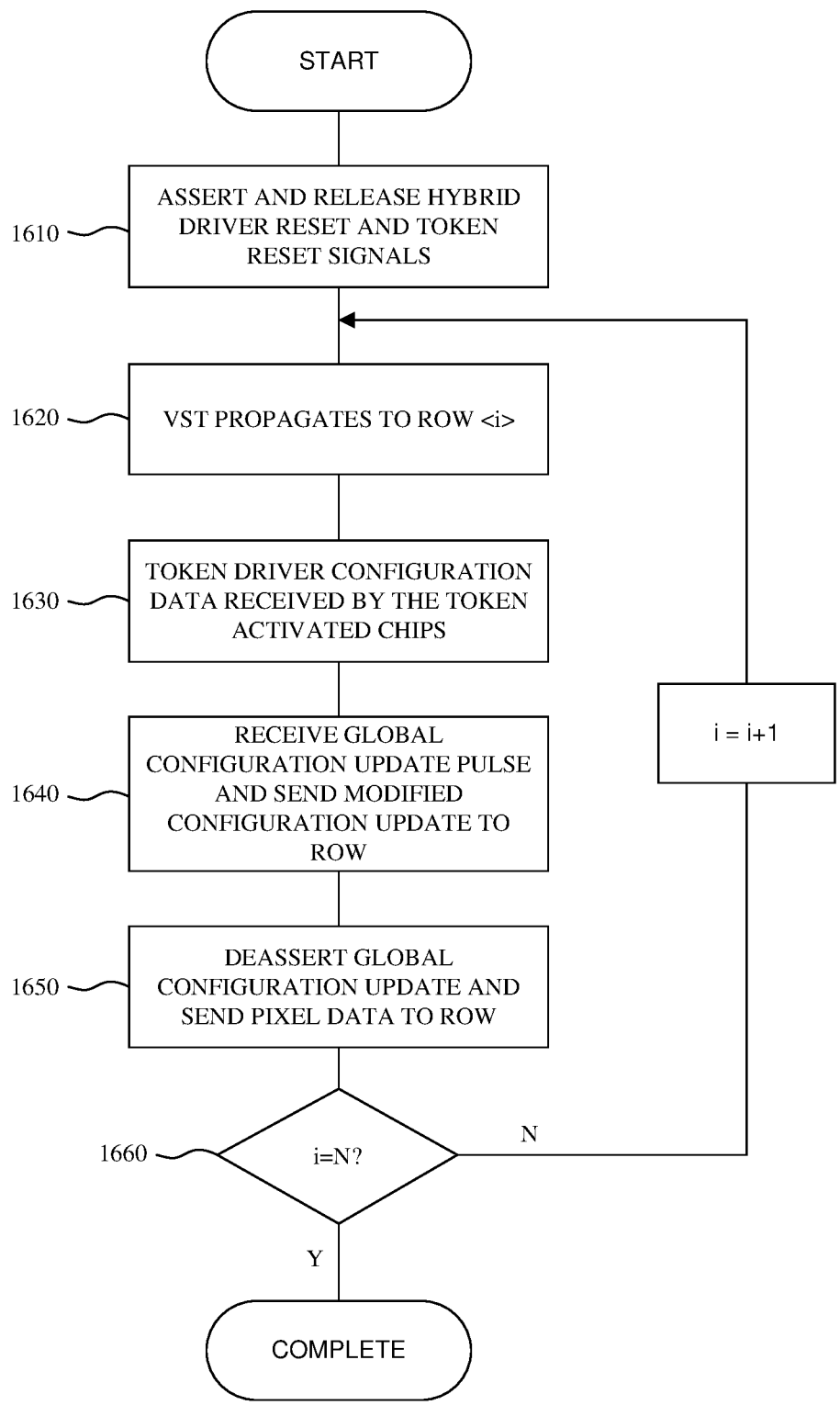
FIG. 16 is a flow chart for a method of programming a display tile from reset in accordance with an embodiment.

FIG. 16 is a flow chart for a method of programming a display tile from reset in accordance with an embodiment. In interest of clarity, description of the method of FIG. 16 is made with reference to features found in FIGS. 15, 14, and 11. Generally, the programming sequence runs down the backbone of the display tile, beginning with row i=0, and ending with row i=N, with 0 being the first (top) row, and N being the last (bottom) row of backbone hybrid pixel driver chips 110B.

The sequence may begin with row i=0, and the hybrid driver reset 690 and token reset 692 signals initially low. At operation 1610 the hybrid driver reset 690 and token reset 692 signals are asserted to high, and released to low. At operation 1620 the VST signals are propagated to row=<i>. At operation 1630 token driver configuration 1510 data is received by the token activated backbone hybrid pixel driver chips. Specifically, token driver configuration 1510 data is received by backbone hybrid pixel driver chips in which the token 1412 signal is high. This may be attributed to the overlap of the VST row capture clock 681 propagating to row <i> during a high token reset 692 signal. The VST row capture clock 681 is used to propagate the token signal row by row. When the token 1412 is high, the hybrid pixel driver chip is open to receive data from data 440 lines. Also a reset signal is generated at the beginning of token 1412 signal in order to reset the existing token states in the activated hybrid pixel driver chip. At operation 1640 a global configuration update 610 pulse and row driver configuration 1520 data are received by the backbone hybrid pixel driver chip, which then generates and sends the manipulated configuration update 610M signal to the row of pixel driver chips 110. At operation 1650 the global configuration update 610 pulse is de-asserted, and pixel data 1530 is sent to all pixel driver chips 110 in the row through the columns of data 440 lines. At operation 1660 the process repeats for the next row if <i> is not equal the number of rows N, and the process completes if this is the last row.

In an embodiment, a method of programming a display includes propagating VST signals (e.g. any of 611, 612, 681, 682) to a row of pixel driver chips 110, receiving token driver configuration data 1510 with a backbone hybrid pixel driver chip 110B, receiving a global configuration update 610 pulse with the backbone hybrid pixel driver chip 110B, receiving row driver configuration data 1520 with the token activated backbone hybrid pixel driver chip 110B, and transmitting a manipulated configuration update signal 610M from the backbone hybrid pixel driver chip 110B to the row (e.g. 1 . . . N) of pixel driver chips 110.

In an embodiment, a repeat VST signal 617 (e.g. 611, 612) is propagated from the backbone hybrid pixel driver chip to a second backbone hybrid pixel driver chip is a second row of pixel driver chips.

In an embodiment the method additionally includes asserting a token reset 692 signal and VST clock (e.g. 681 or 682) signal to the backbone hybrid pixel driver chip 110B to token activate the backbone hybrid pixel driver chip prior to propagating the VST signals to the row of pixel driver chips.

In utilizing the various aspects of the embodiments, it would become apparent to one skilled in the art that combinations or variations of the above embodiments are possible for forming a tile-based display with backbone hybrid pixel driver chips. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display panel comprising:
a display substrate including:
an array of pixel driver chips; and
a column of backbone hybrid pixel driver chips;
wherein each backbone hybrid pixel driver chip is connected to a corresponding row of pixel driver chips within the array of pixel driver chips; and
wherein each pixel driver chip and each backbone hybrid pixel driver chip-is connected to a corresponding matrix of light emitting diodes (LEDs) to drive the corresponding matrix of LEDs.

2. The display panel of claim 1, wherein the wherein each pixel driver chip has a same internal circuitry as each backbone hybrid pixel driver chip.

3. The display panel of claim 2, further comprising a bus column of global signal lines coupled to the column of backbone hybrid pixel driver chips.

4. The display panel of claim 3, wherein each backbone hybrid pixel driver chip comprises an output coupled to a row function signal line connected to the corresponding row of pixel driver chips.

5. The display panel of claim 3, wherein the bus column of global signal lines coupled to the column of backbone hybrid pixel driver chips includes a plurality of global emission clock lines.

6. The display panel of claim 5, wherein each backbone hybrid pixel driver chip comprises a plurality of outputs coupled to a plurality of row function signal lines connected to the corresponding row of pixel driver chips.

7. The display panel of claim 6, wherein the plurality of row function signal lines includes a plurality of manipulated emission clock signal lines.

8. The display panel of claim 1, further comprising a cut-out through the display substrate.

9. The display panel of claim 8, further comprising a bus column of global signal lines coupled to the column of backbone hybrid pixel driver chips.

10. The display panel of claim 9, wherein each backbone hybrid pixel driver chip comprises an output coupled to a row function signal line connected to the corresponding row of pixel driver chips.

11. The display panel of claim 10, comprising:
a first row function signal line above the cutout;
a second row function signal line below the cutout; and
a third row function signal line adjacent the cutout, where the third row function signal line is shorter than the first row function signal line and the second row function signal line.

12. The display panel of claim 10, wherein each matrix of LEDs is a passive matrix.

13. The display panel of claim 12, wherein each LED is a micro LED with maximum dimension of less than 100 μm.

14. The display panel of claim 12, wherein each LED is a micro LED with maximum dimension of less than 10 μm.

15. The display panel of claim 10, wherein the bus column of global signal lines coupled to the column of backbone hybrid pixel driver chips includes a plurality of global emission clock lines.

16. The display panel of claim 15, wherein the bus column of global signal lines coupled to the column of backbone hybrid pixel driver chips includes a global emission row synchronization line.

17. The display panel of claim 15, wherein the bus column of global signal lines coupled to the column of backbone hybrid pixel driver chips includes a vertical selection token (VST) line.

18. The display panel of claim 15, wherein each backbone hybrid pixel driver chip comprises a plurality of outputs coupled to a plurality of row function signal lines connected to the corresponding row of pixel driver chips.

19. The display panel of claim 18, wherein the plurality of row function signal lines includes a manipulated emission clock signal line.

20. The display panel of claim 18, wherein the plurality of row function signal lines includes a plurality of manipulated emission clock signal lines.

\* \* \* \* \*